United States Patent [19]
Chang et al.

[11] Patent Number: 5,687,120
[45] Date of Patent: Nov. 11, 1997

[54] LOW VOLTAGE ONE TRANSISTOR FLASH EEPROM CELL USING FOWLER-NORDHEIM PROGRAMMING AND ERASE

[75] Inventors: Shang-De Chang, Fremont; Jia-Hwang Chang, Cupertino; Edwin Chow, Saratoga, all of Calif.

[73] Assignee: Rohn Corporation, San Jose, Calif.

[21] Appl. No.: 534,700

[22] Filed: Sep. 27, 1995

Related U.S. Application Data

[62] Division of Ser. No. 205,327, Mar. 3, 1994, abandoned.

[51] Int. Cl.⁶ .............................. G11C 7/00; G11C 11/40
[52] U.S. Cl. ........................ 365/185.3; 365/185.29; 365/185.33; 365/185.21; 365/185.18; 365/185.22
[58] Field of Search ............................. 365/182, 185.22, 365/185.16, 185.3, 218, 185.29, 185.33, 185.21, 185.18

[56] References Cited

U.S. PATENT DOCUMENTS

| | | | |
|---|---|---|---|
| 3,593,037 | 7/1971 | Hoff, Jr. | 307/238 |
| 3,660,819 | 5/1972 | Frohman-Bentchkowsky | 317/235 |
| 3,699,646 | 10/1972 | Vadasz | 29/571 |
| 3,728,695 | 4/1973 | Frohman-Bentchkowsky | 340/173 R |
| 3,755,721 | 8/1973 | Frohman-Bentchkowsky | 317/235 |

(List continued on next page.)

FOREIGN PATENT DOCUMENTS

| | | | |
|---|---|---|---|
| 0071603A2 | 6/1979 | European Pat. Off. | H01L 21/28 |
| 0046868A3 | 7/1981 | European Pat. Off. | H01L 29/94 |
| 0 054355 A3 | 11/1981 | European Pat. Off. | H01L 29/78 |
| 0413347A2 | 2/1991 | European Pat. Off. | G11C 16/06 |
| 0449610A2 | 2/1991 | European Pat. Off. | G11C 16/06 |
| 0446893A1 | 9/1991 | European Pat. Off. | H01L 21/336 |
| 0541222A2 | 5/1993 | European Pat. Off. | G11C 16/06 |
| 0548866A3 | 6/1993 | European Pat. Off. | G11C 16/06 |
| 858764 | 9/1977 | France | H01L 29/28 |
| 2464536 | 9/1980 | France | H01L 29/78 |
| 3345173A1 | 7/1985 | Germany | B07C 5/344 |
| 4311358A1 | 10/1993 | Germany | G11C 16/04 |
| 57-114282 | 1/1982 | Japan | H01L 29/78 |
| 6084400 | 3/1994 | Japan | G11C 29/00 |
| 2033153A | 10/1979 | United Kingdom | H01L 29/78 |
| 2099650A | 3/1982 | United Kingdom | G11C 5/027 |

OTHER PUBLICATIONS

Sameer Haddad et al., An Investigation of Erase–Mode Dependent Hole Trapping in Flash EEPROM Memory Cell, IEEE Electron Device Letters, vol. 11, No. 1, Nov. 1990, pp. 514–516.

Samachisa et al., A 128K Flash EEPROM Using Double-Polysilicon Technology, IEEE Journal of Solid State Circuits, vol. SC–22, No. 5, Oct. 1987, pp. 676–682.

Scheibe, A. and Krauss, W., A Two–Transistor SIMOS EAROM Cell, IEEE Journal of Solid–State Circuits, vol. SC–15, No. 3, Jun. 1990, pp. 353–357.

Konemann et al., Built–In Test for Complex Digital Integrated Circuits, IEEE Journal of Solid–State Circuits, vol. SC–15, No. 3, Jun. 1990, p. 315.

Giebel, B., An 8K EEPROM Using the SIMOS Storage Cell, IEEE Journal of Solid–State Circuits, vol. SC–15, No. 3, Jun. 1980, pp. 311–314.

Kynett et al., A 90–ns One–Million Erase/Program Cycle 1–Mbit Flash Memory, IEEE Journal of Solid–State Circuits, vol. 24, No. 5, Oct. 1989, pp. 1259–1263.

(List continued on next page.)

*Primary Examiner*—Viet Q. Nguyen
*Attorney, Agent, or Firm*—Limbach & Limbach L.L.P.

[57] ABSTRACT

A single transistor electrically erasable programmable memory device capable of being programmed and erased using Fowler-Nordheim tunneling and capable of being operated using low voltages. Portions of each of the source and drain regions overlap with the first gate dielectric layer, and the interpoly dielectric layer is chosen to have a high dielectric constant so as to maximize the capacitive coupling ratio between floating gate, control gate, source, and drain. The logical condition of cells in the array is set by first elevating a block of cells to a high voltage threshold and by individually lowering the voltage threshold of selected cells.

3 Claims, 14 Drawing Sheets

U.S. PATENT DOCUMENTS

| | | | |
|---|---|---|---|
| 3,810,127 | 5/1974 | Hoff, Jr. | 340/173 SP |
| 3,825,442 | 7/1974 | Moore | 117/212 |
| 3,825,946 | 7/1974 | Frohman-Bentchkowsky | 357/23 |
| 3,876,887 | 4/1975 | Reed | 307/235 R |
| 3,891,190 | 6/1975 | Vadasz | 357/41 |
| 3,918,149 | 11/1975 | Roberts | 29/580 |
| 3,919,711 | 11/1975 | Chou | 357/23 |
| 3,975,671 | 8/1976 | Stoll | 321/15 |
| 3,978,459 | 8/1976 | Koo | 340/173 R |
| 3,984,822 | 10/1976 | Simko et al. | 340/357 |
| 3,996,657 | 12/1976 | Simko et al. | 29/571 |
| 3,997,381 | 12/1976 | Wanlass | 156/3 |
| 4,013,484 | 3/1977 | Boleky et al. | 148/1.5 |
| 4,013,489 | 3/1977 | Oldham | 148/174 |
| 4,026,733 | 5/1977 | Owen, III et al. | 148/1.5 |
| 4,026,740 | 5/1977 | Owen, III et al. | 156/628 |
| 4,052,229 | 10/1977 | Pashley | 148/1.5 |
| 4,087,795 | 5/1978 | Rossler | 365/185 |
| 4,092,661 | 5/1978 | Watrous, Jr. | 357/23 |
| 4,094,012 | 6/1978 | Perlegos et al. | 365/226 |
| 4,099,196 | 7/1978 | Simko | 357/23 |
| 4,103,189 | 7/1978 | Perlegos et al. | 307/270 |
| 4,114,255 | 9/1978 | Salsbury et al. | 29/571 |
| 4,119,995 | 10/1978 | Simko | 357/200 |
| 4,122,544 | 10/1978 | McElroy | 365/185 |
| 4,153,933 | 5/1979 | Blume, Jr. et al. | 364/23 |
| 4,176,258 | 11/1979 | Jackson | 235/302 |
| 4,180,826 | 12/1979 | Shappir | 357/302 |
| 4,203,158 | 5/1980 | Frohman-Bentchowsky et al. | 365/185 |
| 4,223,394 | 9/1980 | Pathak et al. | 365/41 |
| 4,231,811 | 11/1980 | Somekh et al. | 148/1.5 |
| 4,250,570 | 2/1981 | Tsang et al. | 365/200 |
| 4,257,056 | 3/1981 | Shum | 357/23 |
| 4,266,283 | 5/1981 | Perlegos et al. | 365/104 |
| 4,267,632 | 5/1981 | Shappir | 29/571 |
| 4,441,170 | 4/1984 | Folmsbee et al. | 365/200 |
| 4,451,748 | 5/1984 | Amrany | 307/578 |
| 4,460,982 | 7/1984 | Gee et al. | 365/189 |
| 4,527,180 | 7/1985 | Oto | 357/23.6 |
| 4,551,910 | 11/1985 | Patterson | 29/576 |
| 4,571,709 | 2/1986 | Skupnjak et al. | 365/233 |
| 4,613,886 | 9/1986 | Chwang | 357/42 |
| 4,642,798 | 2/1987 | Rao | 365/230 |
| 4,654,958 | 4/1987 | Baerg et al. | 29/571 |
| 4,658,084 | 4/1987 | Canepa | 365/189 |
| 4,658,160 | 4/1987 | Young | 307/530 |
| 4,698,787 | 10/1987 | Murkherjee et al. | 365/185 |
| 4,780,424 | 10/1988 | Holler et al. | 437/29 |
| 4,784,965 | 11/1988 | Woo et al. | 364/200 |
| 4,804,637 | 2/1989 | Smayling et al. | 437/52 |
| 4,814,286 | 3/1989 | Tam | 437/27 |
| 4,841,482 | 6/1989 | Kreifels et al. | 365/185 |
| 4,860,261 | 8/1989 | Kreifels et al. | 365/218 |
| 4,868,619 | 9/1989 | Murkherjee et al. | 357/23.5 |
| 4,875,188 | 10/1989 | Jungroth | 365/185 |
| 4,875,191 | 10/1989 | Mulder et al. | 365/189.01 |
| 4,930,098 | 5/1990 | Allen | 364/716 |
| 4,949,140 | 8/1990 | Tam | 357/23.5 |
| 5,039,941 | 8/1991 | Tzeng | 365/185 |
| 5,053,990 | 10/1991 | Castro | 324/158 |
| 5,065,364 | 11/1991 | Kreifels et al. | 364/900 |
| 5,075,245 | 12/1991 | Atwood et al. | 365/185 |
| 5,091,332 | 2/1992 | Bohr et al. | 437/69 |
| 5,104,819 | 4/1992 | Freiberger et al. | 437/43 |
| 5,109,187 | 4/1992 | Gulianai | 323/313 |
| 5,120,671 | 6/1992 | Tang et al. | 437/43 |
| 5,136,544 | 8/1992 | Rozman et al. | 437/201 |
| 5,142,495 | 8/1992 | Canepa | 365/189.09 |
| 5,237,535 | 8/1993 | Mielke et al. | 365/218 |
| 5,278,440 | 1/1994 | Shimoji | 257/324 |
| 5,286,994 | 2/1994 | Ozawa et al. | 257/411 |
| 5,311,049 | 5/1994 | Tsuruta | 257/324 |
| 5,357,463 | 10/1994 | Kinney | 365/185 |
| 5,408,431 | 4/1995 | Challa | 365/185 |
| 5,424,993 | 6/1995 | Lee et al. | 365/218 |
| 5,428,578 | 6/1995 | Kaya et al. | 365/218 |
| 5,483,485 | 1/1996 | Marwyama | 365/185.18 |

OTHER PUBLICATIONS

Guterman, et al., An Electrically Alterable Nonvolatile Memory Cell Using a Floating–Gate Structure, IEEE Journal of Solid–State Circuits, vol. SC–14, No. 2, Apr. 1979, pp. 498–508.

Kahng, D. and Sze, S.M. A Floating Gate and Its Application to Memory Devices, May 16, 1967, pp. 1288–1295.

Hijiya et al., Session IX: Nonvolatile Memories, 1982 IEEE International Solid–State Circuits Conference, pp. 116–117.

Muller et al., A 8192–Bit Electrically Alterable ROM Employing a One–Transistor Cell with Floating Gate, IEEE Journal of Solid–State Circuits, vol. SC–12, No. 4, Oct. 1977, pp. 507–514.

Takeda et al., Submicrometer MOSFET Structure for Minimizing Hot–Carrier Generation, IEEE Transactions on Electron Devices, vol. ED–29, No. 4, Apr. 1992, pp. 611–617.

Dill et al., Session IV: Semiconductor Memories, WPM 4.4: Anomalous Behavior in Stacked–Gate MOS Tetrodes, 1969 IEEE International Solid–State Circuits Conference, pp. 44–45.

Verma, G. and Mielke, Neal, Reliability Performance of ETOX based Flash Memories, 1988 IEEE/IRPS, pp. 158–166.

Keeney et al., Complete Transient Simulation of Flash EEPROM Devices, IEEE Transactions on Electron Devices, vol. 39, No. 12, Dec. 1992, pp. 2750–2756.

Jenq et al., Properties of Thin Oxnitride Films Used as Floating–Gate Tunneling Dielectrics, IEDM 82, 30.9, pp. 811–812.

Sternheim et al., Properties of Thermal Oxides Grown on Phosphorous In Situ Doped Polysilicon, Journale of the Electrochemical Society: Solid–State Science and.

Maseo Kurlyama et al. –A 5V–Only 0.6μm Flash EEPROM with Row Decoder Scheme in Triple–Well Structure, 1992 IEEE International Solid State Circuits Conference Digest of Technical Papers, pp. 152–153, Feb. 20, 1992.

Yeargain, J., Kuo, C., "A High Density Floating–Gate EEPROM Cell", IEDM 1981, pp. 24–27.

Kuo, C. et al., "Tham 9.1: A Sub 100ns 32K EEPROM", 1982 IEEE International Solid–State Circuits Conference, pp. 106–107, p. 301.

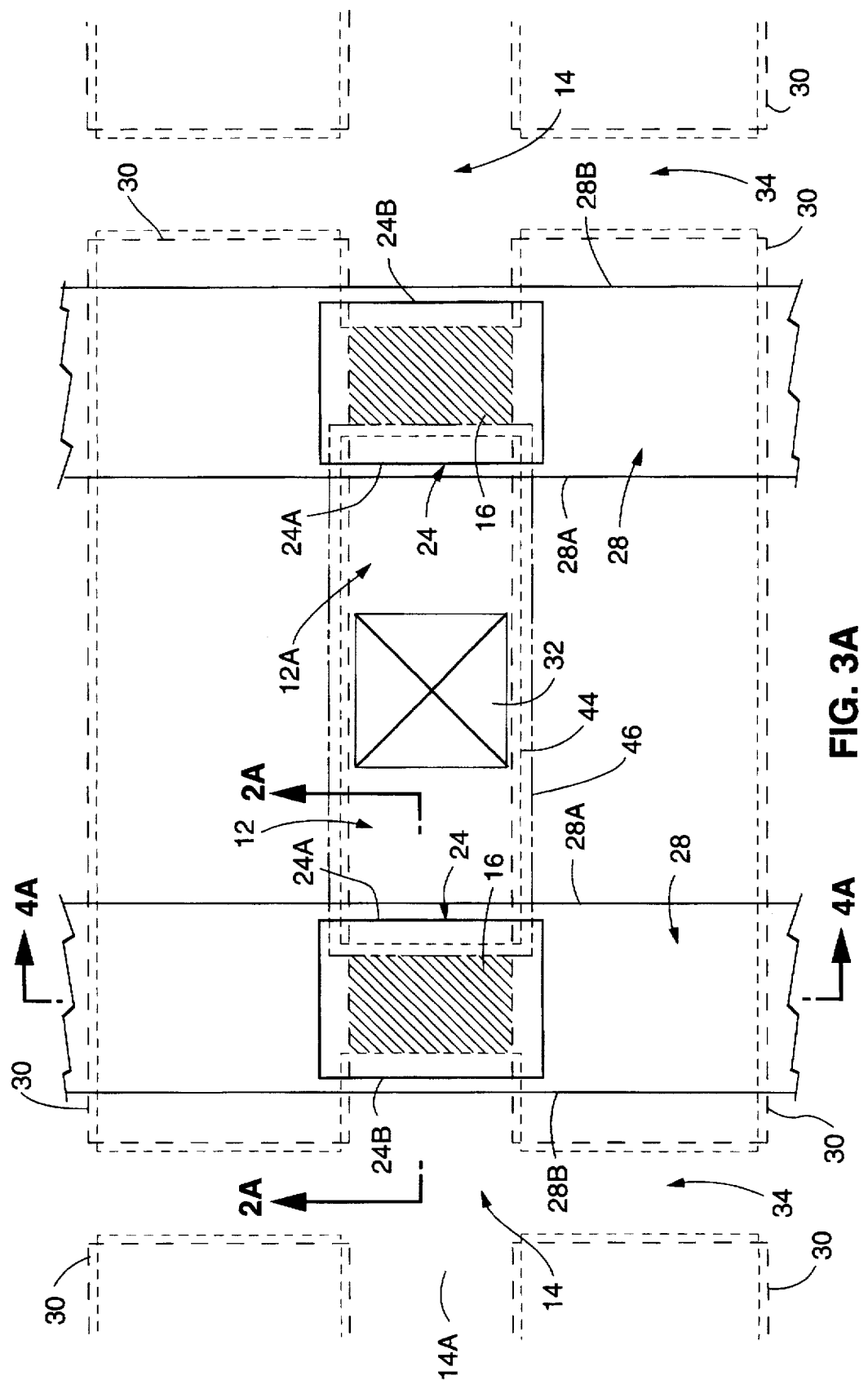

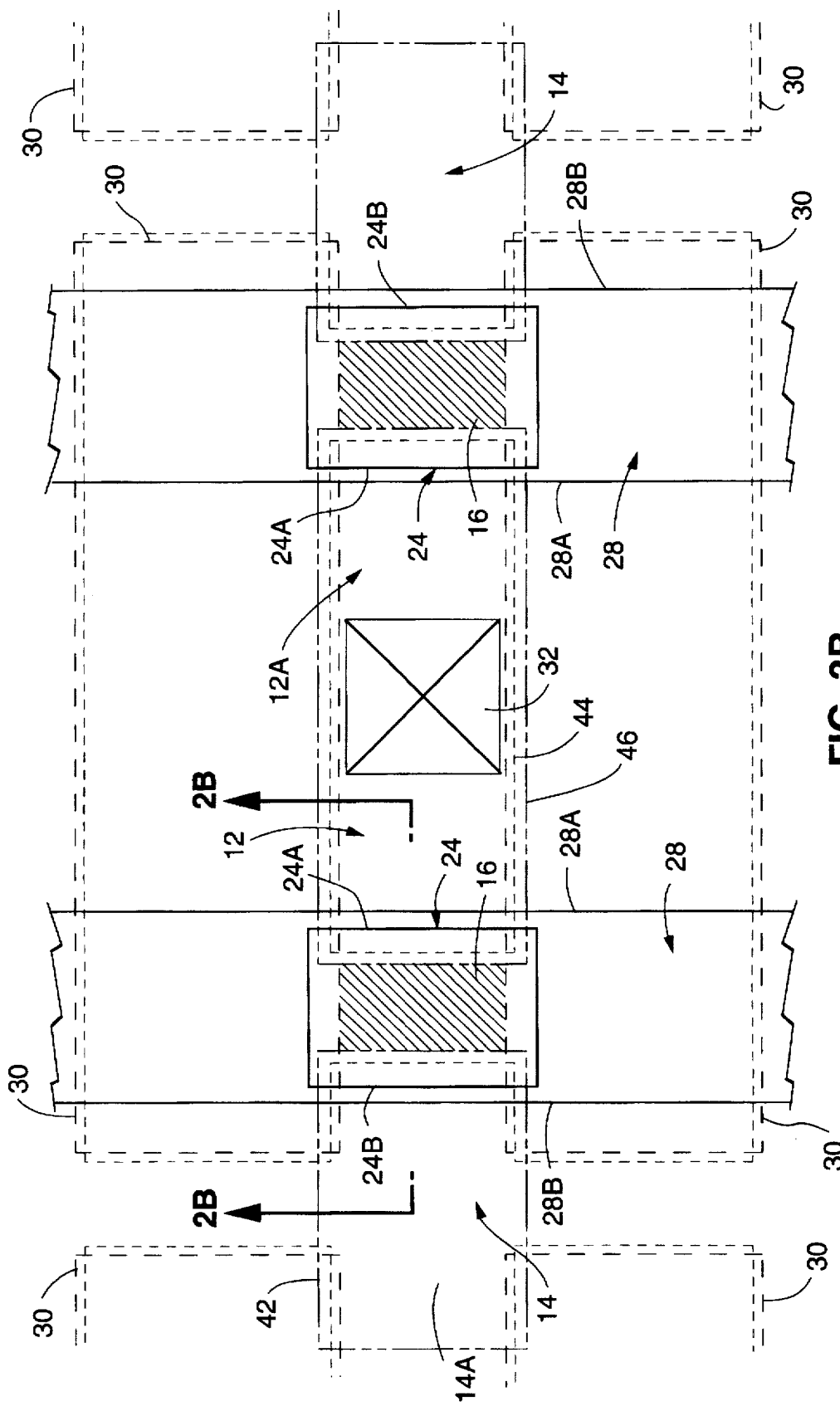

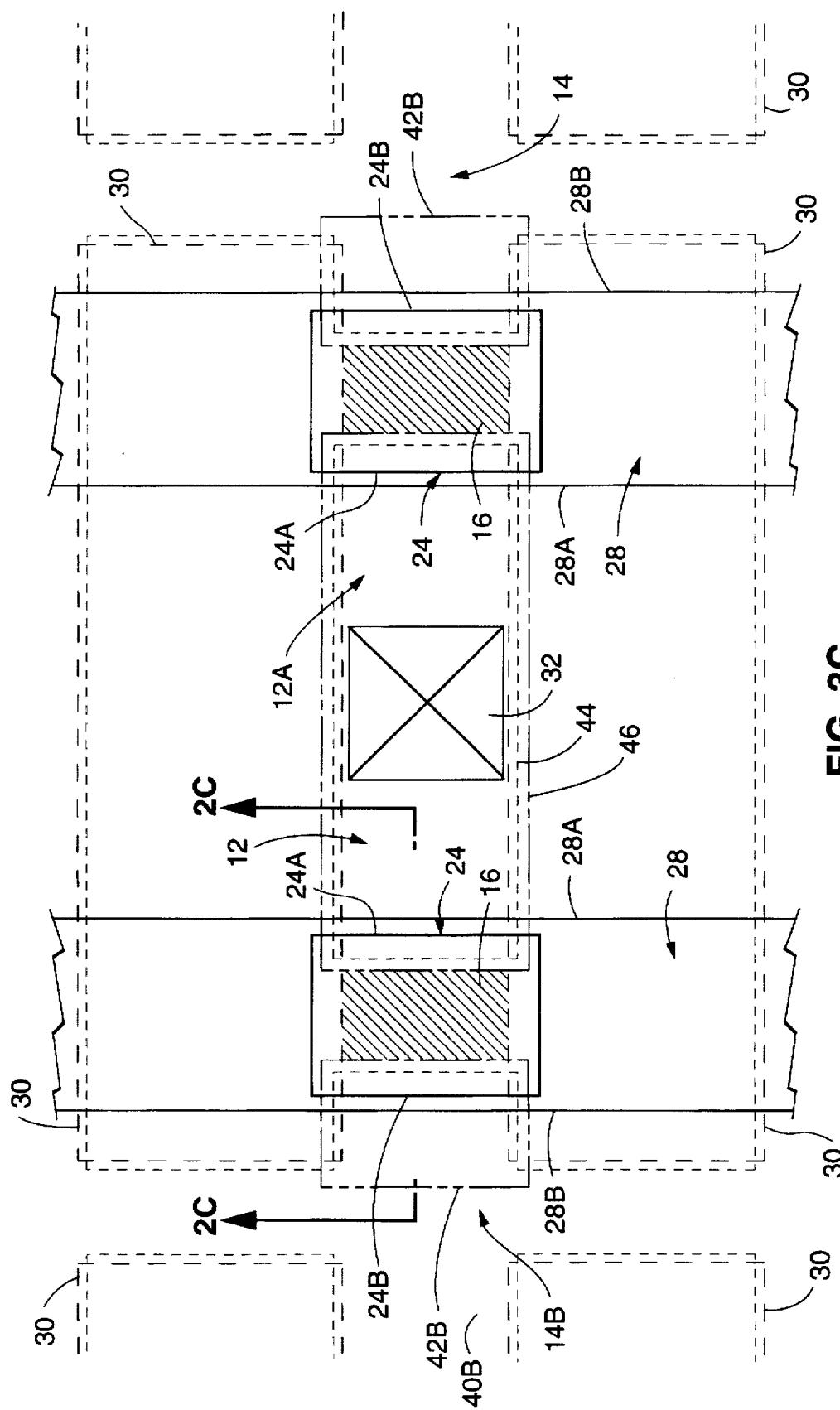

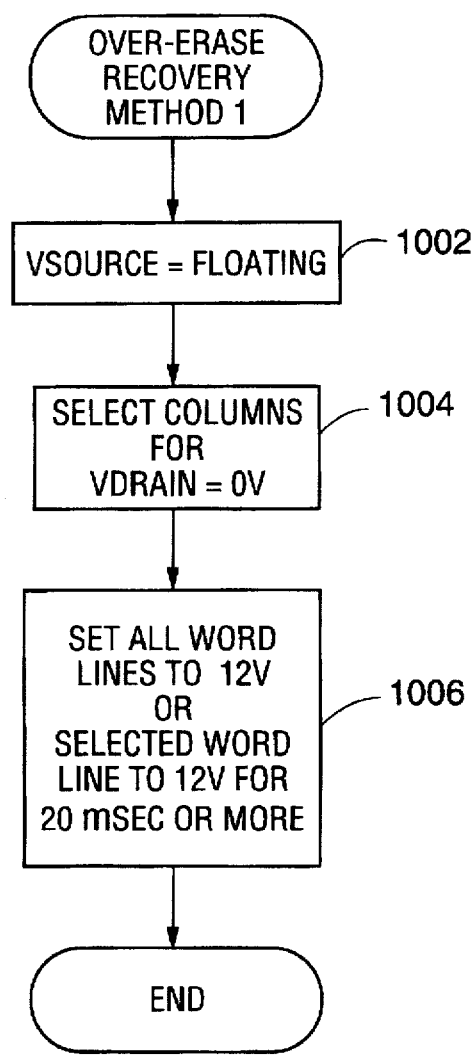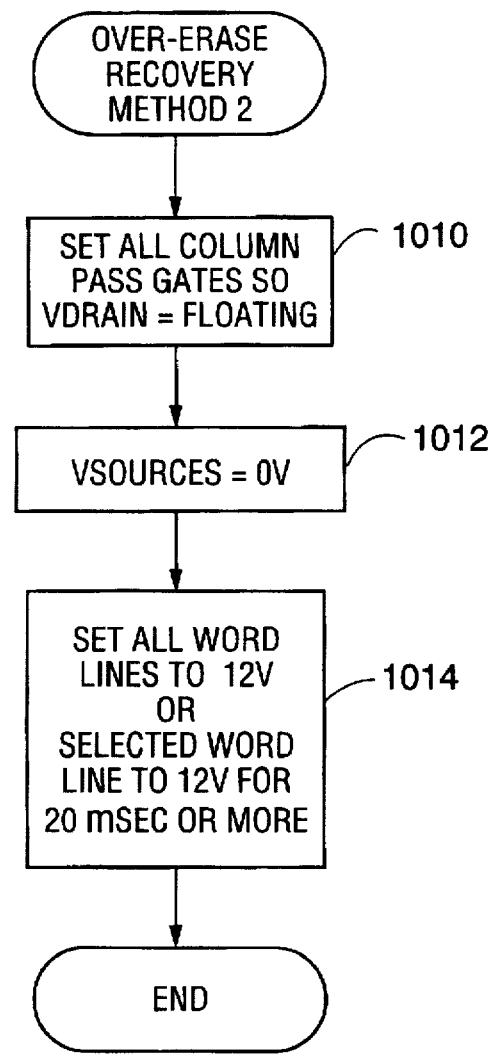
FIG. 10A
FIG. 10B

LOW VOLTAGE ONE TRANSISTOR FLASH EEPROM CELL USING FOWLER-NORDHEIM PROGRAMMING AND ERASE

This is a divisional of application Ser. No. 08/205,327, filed Mar. 3, 1994, abandoned.

FIELD OF THE INVENTION

The present invention pertains to the field of electrically erasable and programmable memory devices and methods for making the same. In particular, the present invention pertains to a low current single transistor Flash EEPROM cell that can be both programmed and erased using Fowler-Nordheim tunneling.

BACKGROUND OF THE INVENTION

Electrically Erasable Programmable Read Only Memory Devices (EEPROMs) and methods for making such devices are well known in the art. One such device, called a flash EEPROM, is disclosed in U.S. Pat. Nos. 4,698,787 and 4,868,619 to Mukherjee et al, and assigned to assignee of the subject application, which are hereby incorporated by reference. A flash EEPROM memory is formed of a high density (e.g. on the order of 1 megabit) array of cells. Each cell is a single-transistor device comprising a body of single crystalline semiconductive material having a source, a drain and a first layer of insulating material positioned on the body. A floating gate is positioned between the first layer of insulating material and a second layer of insulating material, and a gate is positioned over the second layer of insulating material.

The source is formed of a deep region of a first material, such as phosphorous, and a shallower region of a second material, such as arsenic and phosphorus. A portion of the deep region underlies the first layer of insulating material and the first material is selected to optimize the junction overlap with the gate, in order to reduce band to band tunneling during the erase operation. The drain is formed of a shallow region of the second material.

The second layer of insulating material has a high dielectric constant so as to optimize its capacitance. This maximizes the voltage across the floating gate with respect to the substrate and thereby maximizes the ability of the device to store or remove charge on its floating gate.

Programming of a conventional flash EEPROM cell requires applying voltages of approximately 10 V to 12 V and 4 V to 6 V to the control gate and drain, respectively, and holding the source and the substrate at a ground potential. This voltage condition causes hot electrons to be generated from a portion of the substrate (the channel region) lying between the source and drain and to be accelerated onto the floating gate. To erase a flash EEPROM cell, a voltage of between 10 V to 13 V is applied to the source while the drain is floated and the control gate and substrate are held at ground potential. In this way, electrons pass from the floating gate into the source region by Fowler-Nordheim tunneling.

During a read operation, the logical condition of a cell is determined by applying a 1 V to 2 V potential to the drain, a 3 V to 6 V potential to the control gate, and a ground potential to the source. Because a programmed cell has an elevated voltage threshold (Vt) due to the presence of electrons on the floating gate, the channel region of the programmed cell will not conduct during the read operation. On the other hand, an erased cell will have a threshold voltage of approximately 1 V and so its channel region will conduct during a read operation.

Several disadvantages have been associated with conventional flash EEPROM technology. One such disadvantage lies in the use of hot electron injection programming. This programming consumes a great deal of current, making it a technology that precludes the use of internal, on-chip charge pumps when a low voltage (less than 5 volts) supply is used.

Other disadvantages of the current flash EEPROM technology arise from factors which affect cell endurance. For example, when programming a cell, the drains of all cells sharing a column with the cell to be programmed receive the relatively high drain potential required for programming. This is due to the fact that all cells in a column typically share a common bit line. A disturb condition arises in these unselected cells due to the potential difference between the drains (4 V to 6 V) and the substrate (which is held at ground potential). The relatively high voltage drop between the drain and substrate during programming can lead to the formation of hot holes at the drain junctions. These hot holes can migrate onto the gate dielectric and become trapped there permanently, leading to premature failure of the cell.

Hot holes trapped in the gate dielectric will interfere with the read operation of the device and will cause a decrease in the energy barrier between the substrate and the floating gate which is normally provided by the gate dielectric. The decrease in this energy barrier will in turn cause electrons to migrate onto the floating gate of unselected cells. Generation of hot holes may escalate to the extent that the energy level of the hot electrons exceeds that of the electrons, causing band-to-band tunneling which in turn releases additional hot-electron/hot-hole pairs and thus causes further hot hole trapping in the gate dielectric.

Breakdown at the source to substrate junction, which will likewise lead to hot hole generation and trapping, is similarly apt to occur during erasing of conventional flash EEPROM devices because of the high voltage differential between the source (approx. 10 V to 13 V) and the grounded substrate. While this breakdown may be substantially reduced by forming a double diffused source region, adding an additional diffusion layer will not eliminate such effects entirely.

Another disadvantage of present flash EEPROM technology is that over-erased cells cannot be detected bit by bit. An over-erase condition occurs when too many electrons are removed from the floating gate of a cell during erasing, causing the cell to become erased below a Vt of 0 V or to a Vt which causes the cell to conduct even when its word line is deselected. The low threshold voltage of an over-erased cell causes the cell to program and read incorrectly, and over-erased cells normally induce drain leakage current which then masks the logical state of the other cells sharing the same bit line. The presence of an over-erased cell thus cannot be detected bit by bit because when one over-erased cell is present in a column, that cell even when deselected will cause current to flow through the bit line coupled to that column and to thereby obscure the identity of the over-erased cells. Because over-erased cells are difficult to detect, memories found to contain such cells often are discarded, or blocks containing over-erased cells are isolated and replaced with redundant memories. These measures are commonly both costly and inefficient.

Various attempts have been made to develop flash EEPROM devices which minimize the hot hole trapping effects described above. One such device is disclosed in U.S. Pat. No. 5,077,691 to Haddad et al ("Haddad patent"). There a flash EEPROM is disclosed which is erased using Fowler-Nordheim tunneling from the floating gate to the source when a voltage of approximately −17 V to −12 V is applied to the control gate and a voltage of approximately 0.5 V to 5.0 V is applied to the source. Although devices such as that disclosed in the Haddad patent reduce the probability of hot hole trapping effects during erasure, these devices use an elevated drain potential to accomplish programming and thus do not address the drain disturb problem, described above, which occurs in unselected cells. Moreover, programming of these devices is accomplished by hot electron injection programming which as discussed earlier consumes a great deal of current.

Another disadvantage of conventional flash EEPROM devices and devices such as the one disclosed in the Haddad patent is that programming of these devices is accomplished in three steps. First, all cells are programmed to a high Vt by applying the programming conditions for approximately 10 msec. Because hot electron injection is used, this first step uses a high current and thus can only be carried out byte-by-byte. Next, all cells are simultaneously erased using the flash erase function by applying the erase conditions for approximately 10 msec. Finally, dam is placed on the chip by programming the cells byte-by-byte, again using a programming pulse of approximately 10 msec in duration. Programming of these chips is therefore time consuming, particularly due to the fact that they require two programming steps both of which are accomplished byte-by-byte.

Yet another disadvantage with present flash EEPROM devices lies in the fact that the use of high positive potentials at the control gates of the memory cells requires the transistors in the surrounding circuitry to be fabricated with sufficiently high breakdown thresholds so as to prevent breakdown during application of the high gate potentials. Thus, in cells in which programming is accomplished by the application of a 21.0 V potential to the control gate, for example, the peripheral devices will have to be constructed to withstand at least 21.0 V of reverse bias potential.

A device is disclosed in Japanese Patent Early Publication No. 57-114282, which uses Fowler-Norheim tunneling between the substrate and the floating gate to program and erase the device. Further, erasing is performed using high voltages on the drain of the device, so that particular care must be taken to avoid breakdown and other problems involving the drain-substrate junction.

SUMMARY AND OBJECTS OF THE INVENTION

These and other problems of existing flash EEPROM technology are addressed by the present invention.

The electrically erasable programmable memory device of the present invention comprises a body of substrate material having a source and a drain, a first layer of insulating material positioned on the body, a floating gate positioned on the first layer of insulating material, a second layer of insulating material positioned on the floating gate, and a gate over the second layer of insulating material. Potions of each of the source and drain regions overlap with the first layer of insulating material and the floating gate. The second layer of insulating material is chosen to have a high dielectric constant so as to optimize the capacitive coupling ratio between floating gate, control gate, source, and drain.

The capacitive coupling ratios of the above-described structure are configured so that an EEPROM cell is provided in which electrons are placed on and removed from the floating gate using Fowler-Nordheim tunneling, with electrons being placed On the floating gate by way of Fowler-Nordheim tunneling between the drain and the floating gate; and with electrons being removed from the floating gate by way of Fowler-Nordheim tunneling between the floating gate and the source. In an array of such cells, to prepare the cell for programming, all of the cells are raised to a high Vt in a flash program operation by placing electrons on the floating gate and thereby raising Vt to approximately 6 V to 7.5 V. This is accomplished by elevating the potential of the control gate and by grounding the source and floating the drain. Next, cells are erased in a selective erase operation in which electrons are removed from the floating gates of selected cells using Fowler-Nordheim tunneling, thereby lowering Vt to approximately 1.2 V to 2.2 V. The selective erase function is accomplished by applying a relatively large negative potential to the control gate, a moderately high positive potential to the drain, and by floating the source. The substrate is held at a ground potential during both the flash program and selective erase conditions.

The above-described programming characteristics of the device of the present invention reduce the probability of hot hole trapping and band-to-band tunneling by minimizing the reverse-bias voltage differentials between the source and substrate and between the drain and substrate. Further, by using the structure of the present invention an array of cells can be configured which will enable bit by bit detection of cells having an artificially low Vt due to an over-erase condition (i.e. due the removal of too many electrons from the floating gate). The structure of the present invention will likewise enable repair of over-erased cells. Moreover, because the structure and operation of the cell of the present invention is programmed and erased using Fowler-Nordheim tunneling, the device effects a minimal current draw and thus lends itself to the use of low supply voltages and on-cell charge pumps. Finally, processing time is reduced because programming is carried out in just two steps rather than the three normally required for conventional flash devices.

It is therefore an object of the present invention to provide a low-voltage, low-current, single cell EEPROM transistor. It is another object of the present invention to provide an EEPROM transistor capable of being programmed and erased using Fowler-Nordheim tunneling. It is yet another object of the present invention to provide an EEPROM transistor having bit by bit detection and repair modes for over-erased cells.

These and other objectives, features and advantages will become more readily apparent upon consideration of the following description of the preferred embodiment of the present invention.

DESCRIPTION OF THE DRAWINGS

FIGS. 3A, 3B and 3C are top plan views of the EEPROM devices of FIGS. 2A, 2B, and 2C, respectively.

FIGS. 10A and 10B are simplified flow diagrams illustrating over-erase recovery methods of the present invention.

DETAILED DESCRIPTION OF THE INVENTION

Figure 1A:
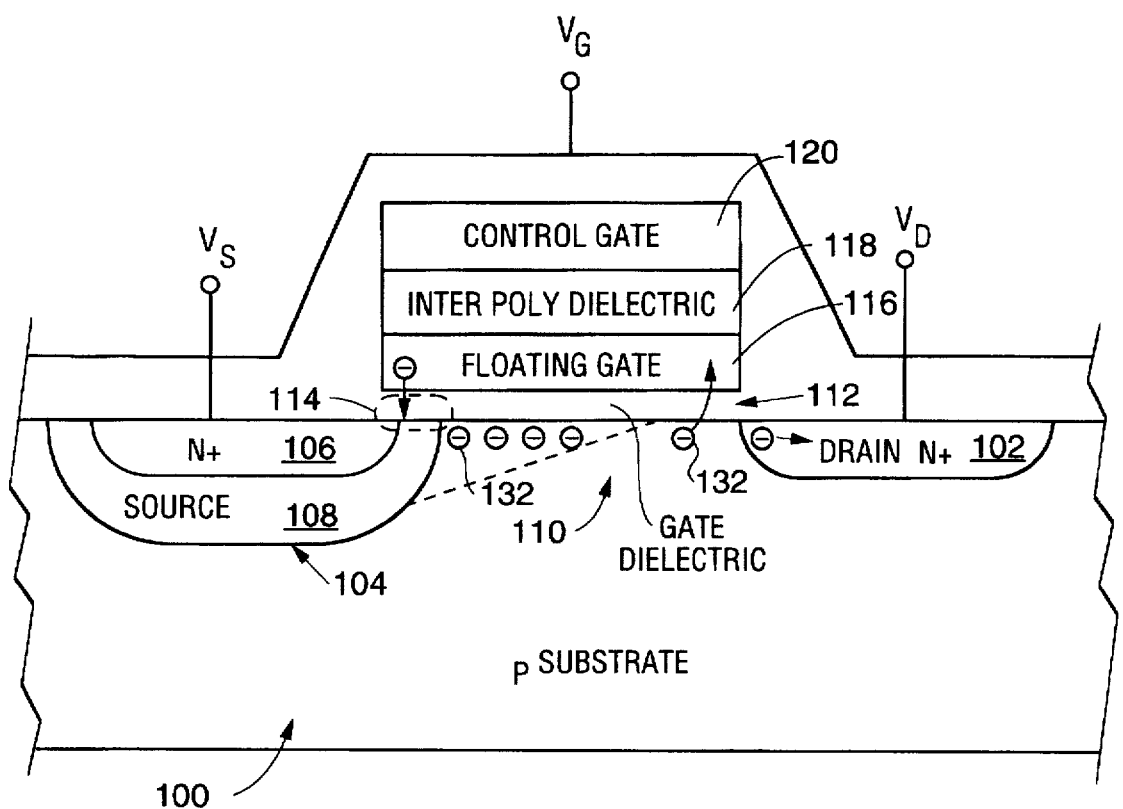
FIG. 1A is a cross-section view of a conventional flash EEPROM device.

A conventional flash EEPROM device of the type shown in the prior art is shown in cross section in FIG. 1A. The device is comprised of a substrate 100 having formed in it a relatively shallow drain region 102 and a deeper source region 104. The source region 104 is double diffused, having a shallow diffusion region 106 and a deeper diffusion region 108. A channel 110 is defined between the source 104 and drain 102.

A gate dielectric 112 having substantially uniform thickness is formed over the channel 110. The gate dielectric 112 extends from the drain and slightly overlaps the source 104 at region 114. A floating gate 116 is formed over the gate dielectric 112, and a second layer of dielectric material 118 is formed over the floating gate 116. Finally, a control gate 120 is formed over the second dielectric layer 118. The second layer 118 is typically referred to as the "interpoly dielectric" due to its position between the control gate and floating gate, both of which are conventionally made from a polysilicon ("poly") or polycide material.

Programming of the flash EEPROM cell shown in FIG. 1A is accomplished by applying a voltage of approximately 10 V to 12 V to the control gate 120, applying approximately 4 V to 6 V to the drain 102, and applying a 0 V potential to the source 104 and the substrate 100.

Programming occurs by hot electron injection, a phenomenon in which high energy electrons 132 are generated in the channel region 110 of the substrate 100 and are accelerated onto the floating gate 116. The presence of electrons on the floating gate raises the threshold voltage (Vt) of the transistor and thus prevents current from flowing through the channel during a read operation.

Erasing is achieved by floating the drain 102, holding the control gate 120 at ground potential, and applying a pulse of high voltage (i.e. between 10 V to 13 V) to the source 104. Under these conditions, Fowler-Nordheim tunneling occurs between the floating gate 116 and the portion of the source diffusion 104 which underlies the floating gate 116 in the region 114. The erasing operation causes Vt of the cell to be reduced to a level of on the order of one volt and thus allows current to flow through the channel 110 during a read operation.

Figure 1B:
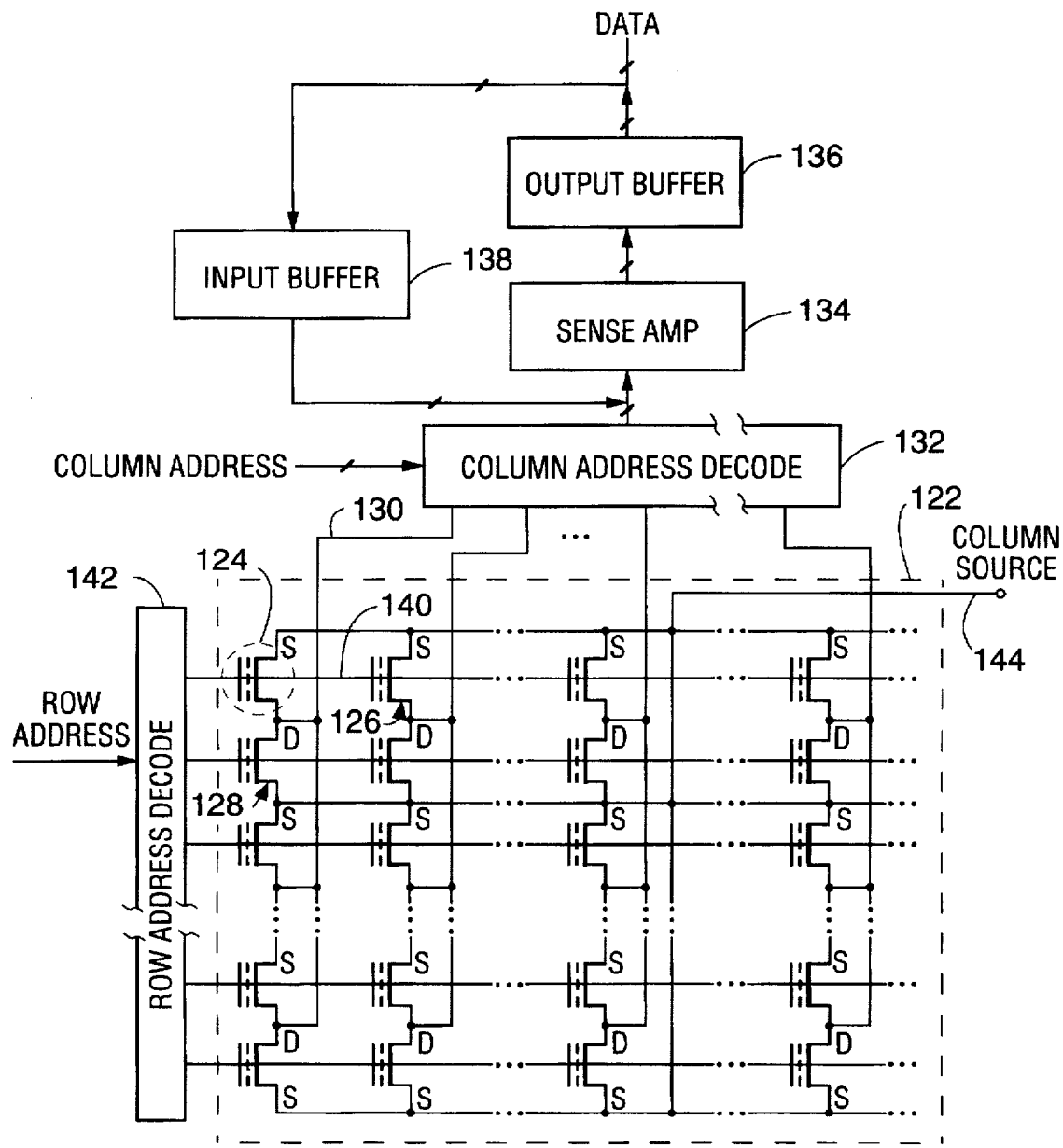
FIG. 1B is a simplified schematic drawing of conventional flash EEPROM cells connected in a memory array.

FIG. 1B illustrates a typical prior art flash EEPROM memory army 122. There it can be seen that adjacent transistors are reversed in orientation. Thus, in the upper left-hand corner of the army, cell 124 has its source connected to the source of cell 126 in the next column. The drain of cell 124 is connected to the drain of cell 128 in the same column. The junction of the drains for cell 124 and cell 128 is connected to a bit line 130 from column address decode circuitry 132. Bit line 130 is connected to all other drain junctions of the cells in the column shared by cells 124 and 128. The gate of cell 124 is connected to word line 140 from row address decode circuitry 142. Word line 140 is connected to the gates of all cells in the same row as cells 124 and 126. A common source line 144 connects the sources of all the cells in the array 122.

An erase operation utilizing the above-described cell will cause all cells in a particular row to be erased. This is accomplished by applying a high potential to the common source line 144 while grounding the word line 140 of the row to be erased. The bit lines 130 are left floating when the device is in erase mode.

An individual cell may be separately programmed by elevating the word line of the row containing that selected cell and the bit line associated with the column of that cell to the necessary potentials.

As was described above, the use of hot electron programming comes a great deal of current and thus precludes the use of low voltage supplies and internal charge pumps. Moreover, the relatively high reverse-bias voltage drops across the drain/substrate and source/substrate junctions during programming and erasing, respectively, increases the probability that hot holes will be generated and trapped in the gate dielectric layer and will also increase the likelihood of band-to-band tunneling. Both of these phenomena have significant adverse effects on cell endurance. Finally, it is difficult to repair over-erased cells using existing technology due to the fact that over-erased cells cannot be detected bit by bit.

Cell Structure

Figure 2A:
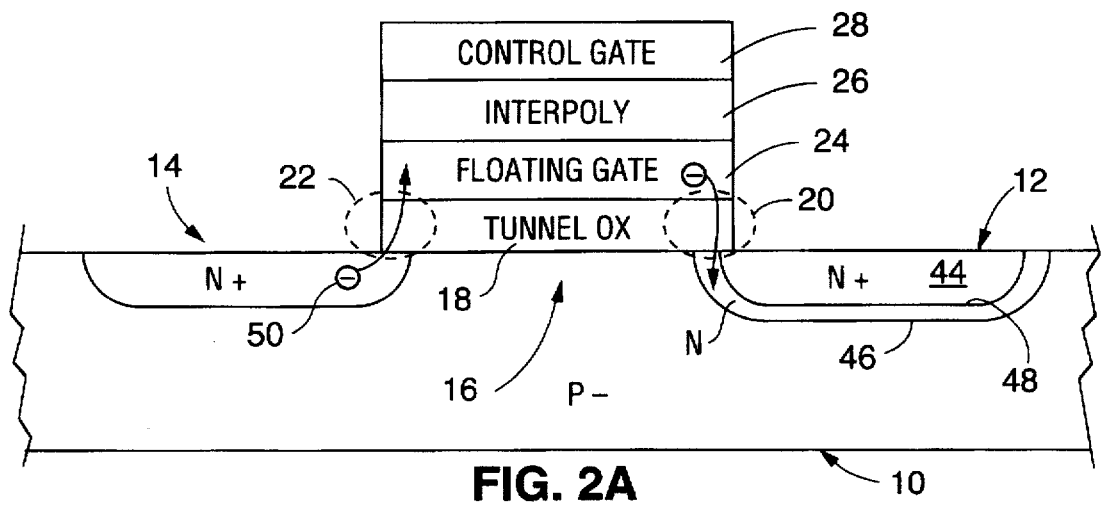
FIGS. 2A, 2B and 2C are cross-section views of the EEPROM device of the present invention showing three alternative configurations for the source region.

The structure of the present invention will now be described. A cross sectional view of the an embodiment of the present invention is shown in FIG. 2A. It is to be noted that while the description of the cell of the present invention is in the context of a grounded potential system, the cell configuration of the present invention could also be used with a "virtual ground" configuration.

A substrate 10 has formed in it a drain 12 and a source 14. A channel region 16 is defined between the drain and source. Over the channel region 16 is formed a gate dielectric layer 18 or "tunnel oxide." A floating gate 24 is formed over the gate dielectric layer 18, and a second layer of dielectric material, the interpoly dielectric layer 26, is formed over the floating gate 24. Finally, a control gate 28 is formed over the interpoly dielectric layer 26.

Figure 2B:
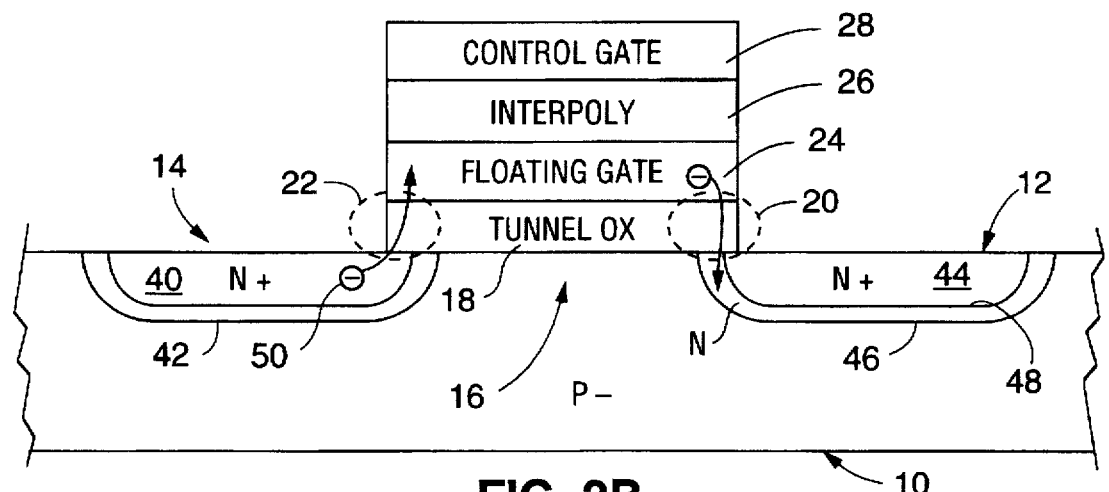
Figure 2C:
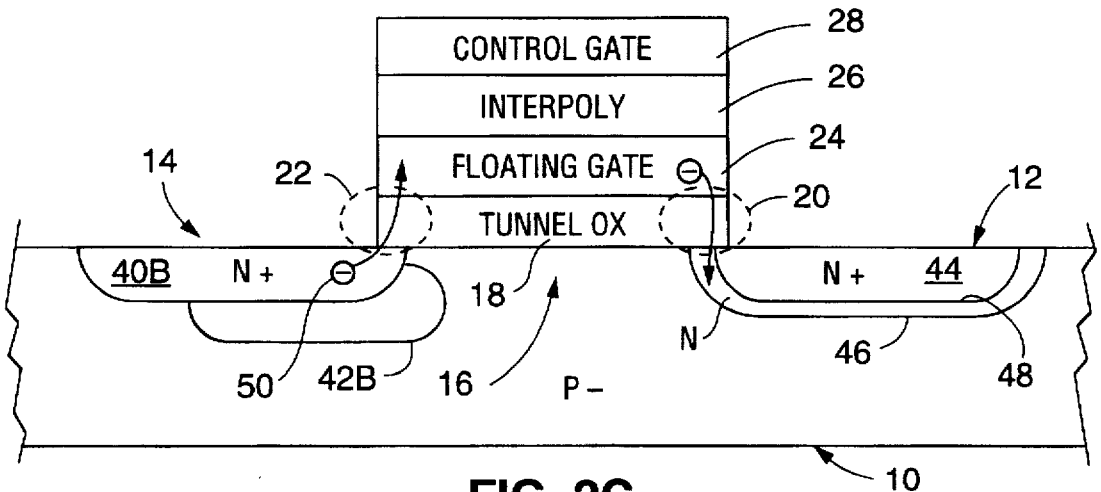

Portions of the drain 12 and source 14, respectively are positioned underneath the gate dielectric layer 18 to permit Fowler-Nordheim tunneling to and from the floating gate, see circled regions 20 and 22, respectively. The source 14 may be a single diffusion $N^+$ type region as shown in FIG. 2A. The source may alternatively have a double diffusion of $N^+$ material such as the source designated 14A in FIG. 2B. This first alternative source 14A has a shallow region 40 and a deeper region 42, both of which are formed of $N^+$ type material. A second alternative source region, designated 14B in FIG. 2C, is formed of a shallow region 40B of $N^+$ material and a deep helo pocket 42B of lightly doped (e.g. $P^-$) P-type material. The preferred depth of the source of FIG. 2A is approximately 0.25 μm (assuming the ratio of lateral diffusion to vertical diffusion to be approximately 0.7 to 0.8).

The drain 12 is preferably N⁺ type material double-diffused to form a shallow region 44 and a deep region 46. The drain may alternatively be single diffusion, in which case the diffusion edge 48 shown in FIG. 2A would not be present. The preferred drain depth is approximately 0.36 μm. A deep drain region is necessary to avoid band to band tunneling and hole trapping effects when an elevated potential is applied to the drain.

The embodiment of FIG. 2A is the preferred embodiment for use with 0.8 μm technology, while the embodiment of FIG. 2C is the preferred embodiment for use with 0.5 μm technology.

The cell layout of the present invention can be seen in the top plan views of FIGS. 3A, 3B and 3C, each of which shows two cells in a mirrored arrangement. In such a mirrored layout, each cell shares a common drain with an adjacent neighbor, and shares a common source with a different adjacent neighbor, in a column of cells (across the page). As can be seen from the figures, the control gate 28 and floating gate 24 are positioned above one another and the channel 16. Although in the figures the boundary of control gate 28 is shown offset from that of floating gate 24, it is to be understood that these regions are "self-aligned" so that floating gate edge 24A is in vertical alignment with control gate edge 28A, and floating gate edge 24B is in vertical alignment with control gate edge 28B. This self-alignment can be seen in FIGS. 2A, 2B and 2C.

A common source line 34, and the word line which is formed in part by the control gates 28 of all cells in a particular row, extend the entire width of the array, so that cells which share the wordline also share the common source line 34.

A drain contact 32 is formed adjacent to the drain region 12. Identical cells surround the cell in mirror-image orientation. For example, immediately adjacent to the contact 32 is the drain region 12A of an adjacent cell, and associated with the source line 34 opposite the source 14 is another source 14A which is part of another adjacent cell.

Figure 4A:
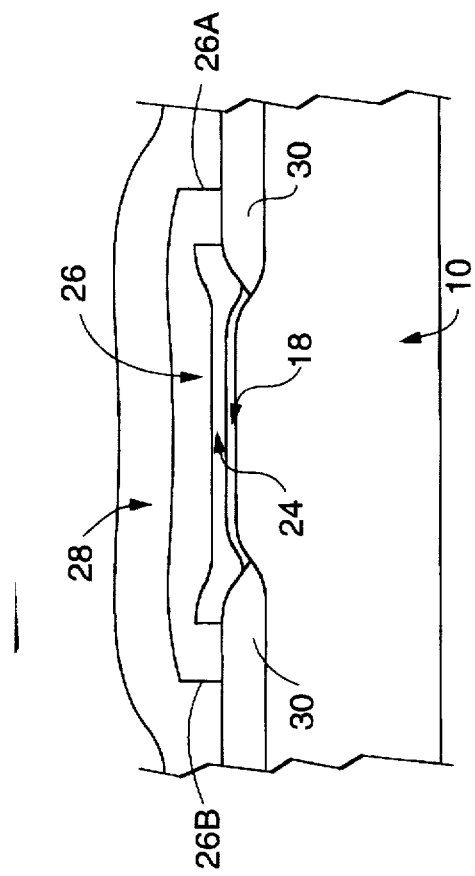
FIG. 4A is a cross-sectional view of a cell taken along line 4A—4A in FIG. 3A.
Figure 4B:
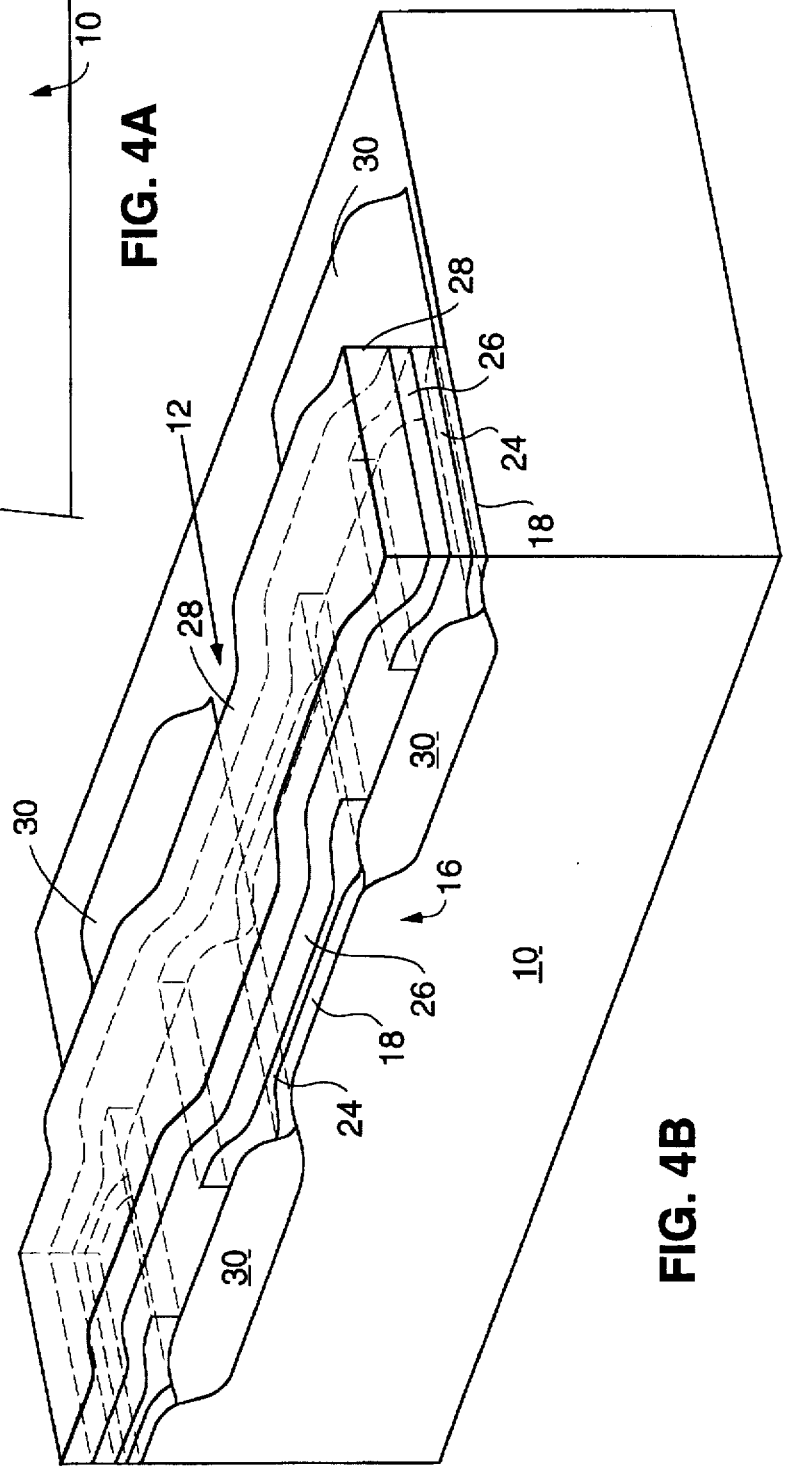
FIG. 4B is a perspective view of the cell of FIG. 4A.

A field oxide layer 30 which, as shown in FIGS. 4A and 4B, is formed beneath the gate dielectric 18, isolates the cell from surrounding cells formed onto the same chip.

The relative positions of the various layers of a cell according to the present invention along line 4A—4A of FIG. 3A can be seen in FIGS. 4A and 4B. It can be seen that in this dimension, there is a slight overlap between field oxide 30 and the gate dielectric 18. The floating gate 24 overlaps the field oxide 30 to a point beyond the end of the gate dielectric 18. The interpoly dielectric layer 26 is shown to extend over the floating gate 24 and beyond the floating gate edges. The interpoly dielectric layer 26 may alternatively have outer edges which are substantially in alignment with those of the floating gate 24. Finally, the control gate 28 is shown to cover the interpoly dielectric layer 26, and to extend beyond its edges.

Cell Operation

A two-step process sets the logical state of a cell according to the present invention. As shown in the following Table A, this operation differs from programming and erasing conventional flash EEPROM devices.

TABLE A

| STEP # | CONVENTIONAL EEPROMs | PRESENT INVENTION |
|---|---|---|
| I | Program all cells to high Vt (byte-by-byte) | Flash program all cells to high Vt (simultaneous or page) |
| II | Flash erase to low Vt (simultaneous) | Selective erase to low Vt (by bit, byte or page) |
| III | Program selected cells to high Vt (byte-by-byte) | |

For conventional flash devices, three steps are used. First, all cells are programmed byte-by-byte to a high Vt by elevating electrons onto the floating gate. Next, all cells are simultaneously erased using the flash erase function to remove electrons from the floating gate. Finally, data is placed on the chip by programming the cells, byte-by-byte, to high Vt.

Setting the logical condition of the present invention differs from the conventional procedure used for existing flash devices in that it is a two-step procedure in which all cells in a page or sector are first raised to a high voltage threshold (i.e. electrons are placed on the floating gates) in a flash program operation. In the second step, selected cells are erased by byte or by page (i.e. electrons are removed from the floating gate).

The following Table B summarizes the preferred operating parameters of the cell of the present invention:

TABLE B

| Operation | $V_G$ | $V_D$ | $V_S$ | $V_t$ | $V_{SUB}$ |
|---|---|---|---|---|---|
| Flash Program | 17 | F | 0 | >6 | 0 |
| Selective Erase | −12 | 5 | F | $0 < V_t < 2.2$ | 0 |
| Over-erase Detect | 1.5 to 2.0 | 1 | 0.6 | N/A | 0 |
| Over-erase Recover | 12 | F | 0 | $0 < V_t < 2.2$ | 0 |
| Read | 5 | 1 | 0 | N/A | 0 |

Table B provides the preferred voltage conditions on the gate, drain, source, and substrate, for each of the listed operations. The $V_t$ column indicates the magnitude of the cell threshold voltage which results from each operation. In Table B, the symbol "F" indicates a floating condition.

Figure 5:
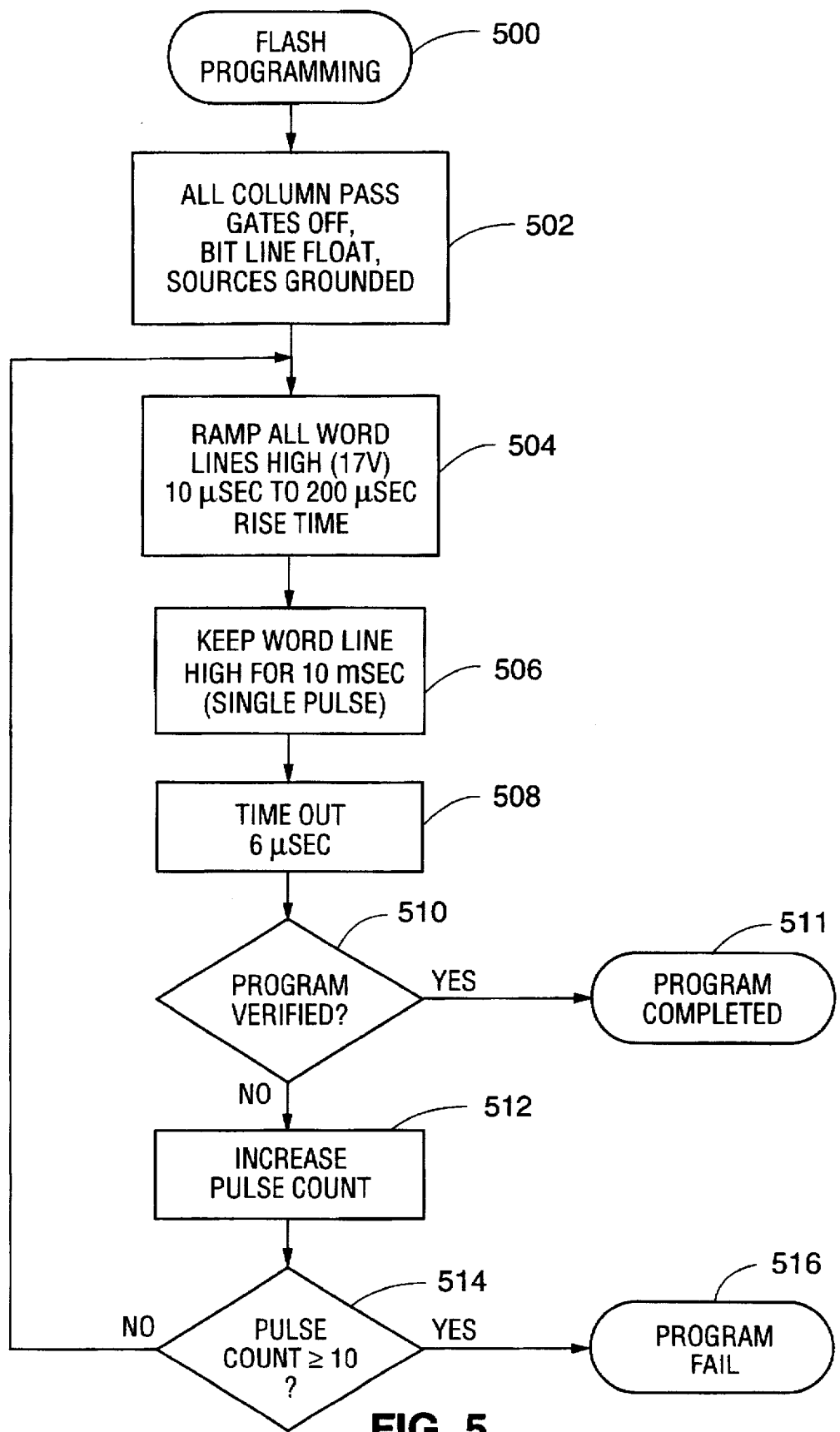
FIG. 5 is a simplified flow diagram illustrating the flash programming operation of the present invention.

The flash program step is a preparatory step in which each cell is raised to a high Vt using Fowler-Nordheim tunneling from the source to the floating gate. This operation can be more easily understood with reference to the flow diagram of FIG. 5.

Flash programming 500 is accomplished by floating the drain 12 and grounding the source 14 and the substrate 10 while a 10 msec pulse of 12 V to 20 V is applied to the control gate 28. Therefore, in step 502 the "pass gates", which route voltages to the columns, are turned off. This causes the "bit lines" of the cells to float, and hence the drains of the cells to float. In step 502, all sources are grounded. Thereafter, in step 504, all word lines are romped to a high potential, e.g. 17 V, using a 10 μsec to 200 μsec rise time. Step 506 keeps the wordlines high for approximately 10 msec to form a single pulse. As a result of the potential applied to the cell in steps 504 and 506, electrons 50 tunnel from the source 14 through portion 22 of the gate dielectric region 18 and onto the floating gate 24. See FIG. 2A. Flash programming preferably results in a voltage threshold of greater than 6 V. Step 508 provides a 6 microsecond time out which permits discharging of the wordline from 12 V to 20 V down to 3 V to 6 V. Step 510 is a program verify step in which the logic state read from the programmed cells are compared against the desired logic state for the cells. If the program is verified, step 511 is then taken to indicate that the programming has been completed.

If in step 510 the program is not verified, a pulse count is incremented. In step 514 the pulse count is checked to make sure that it does not equal or exceed a selected number; e.g. ten pulses. If such a condition is detected, the programming effort is deemed to have failed, step 516.

As long as the number of pulses applied to the wordlines does not equal or exceed the selected number, step 514 causes the application of additional pulses to the word lines by looping the operation back to step 504.

In the preferred embodiment, the flash program step is performed row-by-row by floating all bit lines 130A, grounding the common source line 144A, and elevating the word line 140A for each row.

Because the P-type substrate 10 is grounded during the flash program operation, the effect of the channel region 16 on this operation is small due to the high depletion capacitance across the substrate. This effect could be further minimized by floating the substrate during flash programming. However, unless the substrate region below the channel is isolated from the remainder of the substrate by an N-type well, it is not possible to float the substrate due to the fact that the entire EEPROM cell is built into the substrate. Such a well can be formed using a triple-well process, for example, where an $N^-$ well is formed in a $P^-$ substrate, and then a $P^-$ region is formed within the $N^-$ well to serve as the effective substrate for the cell of the present invention.

Figure 6:
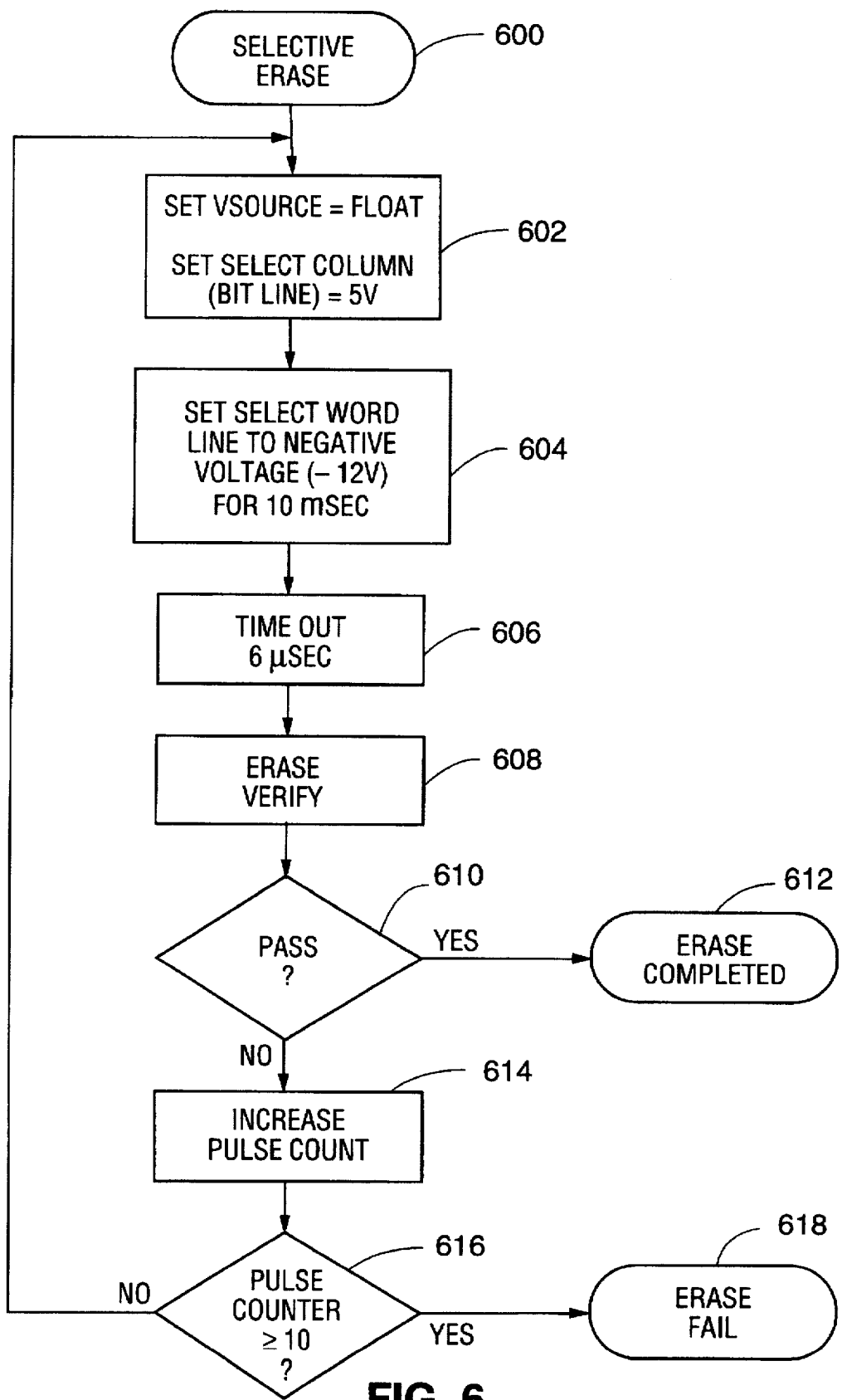
FIG. 6 is a simplified flow diagram illustrating the selective erase operation of the present invention.

The selective erase step 600 is one in which individual cells are set to the desired logical condition by removing electrons from the floating gates of selected cells rising Fowler-Nordheim tunneling at the drain to bring those cells to a low Vt. The flow diagram of FIG. 6 illustrates the selective erase operation.

Selective erase is carried out by first floating the source and grounding the substrate while applying a potential of 2.0 V to 5.0 V to the drain, in step 602. Thereafter, in step 604, a 10 msec pulse of −10 V to −15 V to the control gate (word line). This is followed by a 6 μsec timeout, step 606; and then an erase verify step 608. If the erase was successful, as determined in step 610, the erase operation is deemed completed in step 612. On the otherhand, if the erase could not be verified in step 68, step 614 is run to increment the pulse count and to loop back, via step 616, to apply another erase pulse. If in step 616 it is determined that ten or more pulses were already applied to the cell without a successful erase, step 618 indicates an erase failure.

As will be discussed below, this step may be carried out bit by bit by applying the appropriate potentials to the word line 140A and the bit line 130A of the selected cell. Properly erased cells will preferably have a voltage threshold of approximately 0 V to 2.2 V.

Erasing may also be carried out using positive gate voltages. However, caution should be used to ensure that the gate voltage used will be low enough relative to the breakdown potential of the transistors in the peripheral circuitry so as to avoid the breakdown problem described with respect to the prior art.

Over-erase and Detection

During the selective erase step, too many electrons may be erroneously removed from some of the cells in a cell array, causing the cell to have a very low Vt (e.g. less than 0 V). This low threshold voltage causes the cell to read incorrectly. Moreover, a cell with an abnormally low Vt will normally induce current flow on the bit line which then prevents detection of the logic states of other cells sharing the same bit line. This is because such a cell will conduct current under conditions which would normally prevent a properly erased cell from conducting. This condition is conventionally referred to as "over-erase."

Because the memory device of the present invention allows for erasure by the byte when the preferred program and erase modes are used, it is easier to locate over-erased cells than it is for conventional devices. However, if the cell of the present invention is programmed and erased using conventional programming and erase techniques, the difficulties in over-erasure detection will be the same as those found with conventional devices.

Whether the cell of the present invention is over-erased may be determined by measuring whether there is current flow through the cell in response to application of a read voltage that is much lower than that which would normally cause conduction through the channel of a properly erased cell. In other words, a cell is over-erased when its threshold voltage is low enough that conduction occurs through a deselected cell.

For over-erase detection, a test voltage $V_{test}$ is applied to control gate 28 for approximately 10 msec while a bias voltage $V_S$ is applied to the source 14. A voltage of approximately 1 V to 2 V is applied to the drain 12. The test voltage is normally between 0 V to 2 V and in the preferred embodiment is approximately 1.5 V to 2 V. The preferred bias voltage $V_S$ is approximately 0.6 V.

A normally erased cell will not have channel conduction under these test conditions. This is because the threshold voltage of a normal cell will be such that the low voltage of 1.5 V to 2.0 V applied to the control gate 28 will be insufficient to turn on the channel 16. However, an over-erased cell will have a very low (e.g. less than 0 V) voltage threshold because removal of too many electrons from the floating gate 24 will remit in holes remaining on the floating gate 24 which do not have corresponding electrons. Thus, these remaining holes produce a field which when enhanced by the 1.5 V to 2.0 V test voltage applied the control gate, will cause conduction in the channel.

A source bias voltage $V_S$ is used in connection with testing cells in an array of cells for an over-erased condition. By biasing all sources in the array to a small positive voltage, e.g. 0.6 V, over-erased cells in a non-selected ($V_G$=0 V) row will be kept off, and thereby prevented from interfering with the detection of an over-erased cell in a selected ($V_G$=$V_{test}$) row.

The test voltage $V_{test}$ is chosen to have a magnitude which, when applied to the gate of an over-erased cell will cause the over-erased cell to conduct, even when the source bias voltage $V_S$ is applied to its source.

Therefore, the test voltage $V_{test}$ is a function of (1) the voltage $V_S$ applied to the source during the over-erase detect operation, and (2) the threshold Vt used to define an over-erase condition. It is also a function of the reference voltage used by the sense amplifier which reads the logical condition of the column. Selection of the test voltage, $V_{test}$, will next be described.

The current through a cell, $I_{cell}$, will be greater than 0 V when:

$$V_G - V_S - Vt > 0 \text{ V}$$

where $V_G$ and $V_S$ are the voltages applied to the control gate 28 and source 14, respectively.

The voltage threshold of an over-erased cell is that which will allow conduction even though the over-erased cell is deselected; i.e. when $V_G=0$ V. In the preferred embodiment of the inventive over-erase detection method, a cell having a voltage threshold of approximately −0.5 V or lower has been defined to be an over-erased cell. Because the "actual" voltage threshold differs from the "effective" voltage threshold due to body effects, the effective voltage threshold will be referred to as Vt while the actual voltage threshold will be identified as $Vt_\phi$. Using this terminology, the actual voltage threshold can be defined to be $Vt_\phi \approx -0.5$ V, for example, for an over-erased cell. It is to be understood that other magnitudes can be selected to define an over-erased cell, and that the source bias voltage, $V_S$, and the test voltage, $V_{test}$, should be adjusted accordingly.

The effective threshold voltage Vt may be defined as:

$$Vt = Vt_\phi + \Delta V_{body\ effect}$$

where $\Delta V_{body\ effect}$ is the change in voltage threshold caused by the body effect. This value is approximately 1.5 V for the device of the present invention.

Since it has been designated that $Vt_\phi \approx 0.5$ V for an over-erased cell, it follows that:

$$Vt = (-0.5) + (1.5)$$
$$= 1.0 V$$

As discussed above, the source voltage used for the bias condition, $V_S$, is selected to be a voltage that would be sufficient to "turn off" the channel of an over-erased, but non-selected, cell. For the present invention, a source voltage of approximately 0.6 V has been found to be satisfactory. Thus, since $$V_G - V_S - Vt > 0,$$

then $$V_G - 0.6 \ V - 1.0 \ V > 0,$$

and $$V_G > 1.6 \ V = V_{test}.$$

where $V_{test}$ is the test voltage applied to the control gate 28 as a part of the over-erase detection procedure.

Thus, it should be appreciated that $V_{test} = 1.6$ V is large enough to cause an over-erased cell to conduct when its source has a source bias voltage $V_S=0.6$ V applied to it; but, on the other hand, $V_{test}=1.6$ V is too low to cause a cell which has a proper voltage threshold to conduct. In this manner, individual, over-erased cells can be detected. It is to be understood that other source bias voltages, $V_S$, and test voltages, $V_{test}$, can be used within the spirit of the present invention, and that when a different threshold voltage is designated as indicating and over-erase cell, appropriate adjustments of these voltages should be made.

Over-erase Recovery

Referring back to Table B, in the one preferred recovery method, electrons are replaced on the floating gate using Fowler-Nordheim tunneling by grounding the source 14 and leaving the drain 12 floating, while a pulse of preferably 12 V is applied to the gate 28 for 10 msec. The over-erased cells are subsequently re-tested and, if they still conduct at the test voltage, the recovery and test modes are repeated until all of the improperly over-written cells have been repaired, or identified as unrepairable. Alternatively, the source can be grounded and the drain floated to repair the over-erased cells.

The logical condition of the cell may be determined by applying a read voltage of approximately 3 V to 5 V to the gate and a voltage of approximately 1 V to the drain. The channel of a programmed cell, i.e. one having electrons on the floating gate sufficient to create a high threshold voltage, will not conduct current during the read operation while an erased cell will conduct. As with all operations, the substrate is preferably grounded during the read operation.

Optimizing Cell Performance

Figure 8:
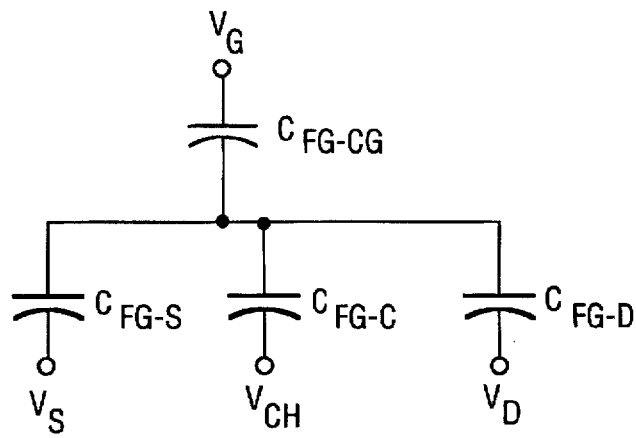
FIG. 8 illustrates the equivalent capacitive circuit of the device of the present invention.

Adequate capacitive coupling between the control gate, floating gate, source, channel, and drain regions of the cell is important to the device's ability to move charge to and from the floating gate during the programming and erase functions. A circuit representing the capacitive coupling between these components is shown in FIG. 8. The capacitance between the floating gate and control gate is represented by capacitor $C_{FG-CG}$, and the capacitances between the floating gate and source, floating gate and channel, and floating gate and drain are represented by capacitors $C_{FG-S}$, $C_{FG-C}$ and $C_{FG-D}$, respectively.

It can be shown that the capacitive coupling ratio for the device is defined by the equation:

$$\text{Coupling Ratio} = \frac{C_{FG-CG}}{C_{FG-CG} + C_{FG-S} + C_{FG-C} + C_{FG-D}}$$

It is to be noted that in the preferred embodiment of the present invention Fowler-Nordheim tunneling is used on the source side to tunnel electrons from the source 14 to the floating gate 24, and used on the drain side to tunnel electrons from the floating gate 24 to the drain 12. The coupling ratio present in the source-to-floating gate tunnelling operation is therefore determined by a different section of the cell than the coupling ratio present during the floating gate-to-drain tunneling operation.

It follows that during the flash programming step, the coupling ratio between the control gate and the substrate may be expressed as:

$$\text{Coupling Ratio} = \frac{C_{FG-CG}}{C_{FG-CG} + C_{FG-S} + C_{FG-C} + C_{FG-D}} = \frac{A_1/T_1}{A_1/T_1 + A_2/T_2}$$

where $A_1$ and $T_1$ are the area and the effective thickness, respectively, of the interpoly dielectric layer 26, and $A_2$ and $T_2$ are the area and the effective thickness, respectively, of the gate dielectric layer 18 which overlays the channel, source, and drain.

During the selective erase step, because the source is floated, the coupling ratio between the control gate and the substrate may be expressed as:

$$\text{Coupling Ratio} = \frac{C_{FG-CG}}{C_{FG-CG} + C_{FG-C} + C_{FG-S}} = \frac{A_1/T_1}{A_1/T_1 + A_3/T_3}$$

where $A_3$ and $T_3$ are the area and effective thickness, respectively, of the gate dielectric layer 18 which overlaps the channel, drain and source.

The coupling ratio should be maximized, and should preferably be at least 65%, so as to maximize the voltage across the floating gate 24. The coupling ratio is optimized in a number of ways. For example, choosing a material for the interpoly dielectric layer 26 having a high dielectric constant will give the interpoly dielectric layer 26 a smaller effective thickness and will thus provide a high capacitance between the control gate 28 and the floating gate 24 without the need for a large area. The greater the capacitance $C_{FG-CG}$ between the control gate 28 and the floating gate 24, the less effect the remaining capacitances will have on the voltage across the floating gate.

The interpoly dielectric material is preferably an oxide-nitride-oxide (ONO) layer having a thickness of 185 Å±15 Å. In the preferred embodiment, the interpoly dielectric material comprises a 120 Å layer of nitride sandwiched between two 70 Å layers of oxide formed using a conventional oxide-nitride-oxide process, preferably a standard high temperature oxide deposition (HTO) so as to optimize endurance. Due to the high dielectric constant of the nitride, the effective thickness of the preferred interpoly dielectric layer 26 is 200 Å while the actual physical thickness is 260 Å.

The interpoly dielectric layer should be made symmetrical because doing so avoids imposing differing stresses on the layer during the erasing and programming operations. While the use of a symmetrical ONO layer is used to obtain some improvement of endurance reliability (i.e. reduced ONO breakdown) in conventional Flash EPROMS, the use of symmetry in the ONO layer of the present invention produces a dramatic improvement in endurance.

Another way in which the coupling ratio can be optimized is by limiting the width of potions 22, 20 of the source 14 and drain 12, respectively, that overlap with the gate dielectric layer 18. This maintains an optimized capacitance between the floating gate and the drain and between the floating gate and the source and thus maximizes the voltage between the floating gate and drain and floating gate and source. For devices having control gate and floating gate widths of 0.8 μm ("0.8 μm technology"), the source overlap 22 is preferably 0.2 μm, with a drain overlap 20 of 0.3 μm and an effective channel 16 of length 0.3 μm. For 0.5 μm technology, the preferred source overlap 22 is 0.12–0.15 μm with a drain overlap 20 of 0.3 μm and an effective channel length of 0.15–0.18 μm. It should be added that other considerations entering into the selection of the gate dielectric include maximization of endurance, which necessitates selection of a gate dielectric material having optimal trapping characteristics, and facilitation of Fowler-Nordheim tunneling, which requires a thin gate dielectric. Silicon dioxide is the preferred material for the gate dielectric layer because of its ability to meet these criteria.

Fowler-Nordheim tunneling results when an electric field of at least 6 megavolts/centimeter is generated across the region of overlap between the source 14 and floating gate 24, although a preferred tunneling condition results when the field is approximately 11 to 12 megavolts/centimeter. The thickness of the gate dielectric layer 18 should be chosen to achieve a field in this range of magnitude during the flash program and selective erase modes. A thickness of 84 Å±4 Å is suitable for the present invention and a thickness of 80 Å has been found to be preferable.

Because the gate dielectric layer 18 must be thin, $T_2$ and $T_3$ in the coupling ratio calculations are very low and thus work to limit the coupling ratio. The adverse effects of the thin gate dielectric on the coupling ratio may be compensated for by increasing the amount by which the interpoly dielectric layer 26 overlaps the field oxide 30 (see FIG. 4A). This increase in overlap helps to optimize the coupling ratio because it increases the area $A_1$ of the interpoly dielectric layer 26. Moreover, because the extra area occurs only over the field oxide layer 30 and not over the source and drain regions, the capacitances of the device are not adversely affected.

The voltage $V_{FG}$ of the floating gate relative to the substrate during the selective erase step may be expressed as:

$$V_{FG} = \frac{V_G C_{FG-CG} + V_D C_{FG-D}}{C_{FG-CG} + C_{FG-C} + C_{FG-D}}$$

wherein $V_G$ and $V_D$ are the voltages applied to the control gate 28 and drain 12, respectively. The coupling ratio is more critical during the flash programming step than it is during the selective erase step. For the selective erase mode, the ratio of capacitance represented by:

$$C_{FG-CG} : C_{FG-D} : C_{FG-C} : C_{FG-S}$$

is preferably: 65:13:13:9.

Thus the area and thickness parameters discussed above with respect to the capacitances across the dielectric layers should be determined with respect to the flash program step. Once these values are determined, the voltages $V_G$ and $V_D$ should then be determined using the above equation to achieve a desired $V_{FG}$.

Typically when a voltage of 5 V is applied to the drain during the selective erase operation, $V_{FG}$ will be approximately −5 V. A voltage of 3 V on the drain will cause the floating gate to see a voltage of approximately −7 V. Endurance is optimized when the lowest possible voltage is applied to the drain due to the hole trapping effects discussed above. Minimizing the thicknesses of the gate dielectric layer 18 and the interpoly dielectric layer 26 will thus serve to minimize the drain voltage needed during the selective erase step and will thus minimize the endurance problems associated with high drain voltages.

Doping in the channel of the present invention is much heavier (i.e. approximately 10 times heavier) than that typically used in conventional flash EPROM cells in order to raise the voltage threshold and to thereby balance the stresses on the device during flash programming and selective erase. Moreover, when the threshold voltage is increased, lower gate voltages are needed and so the breakdown voltage requirements for peripheral devices are thereby relaxed. The preferred doping is that which will raise the initial voltage threshold, $Vt_i$, of the device to between 4 V and 5 V, and preferably to approximately 4.5 V.

The following table illustrates the benefits afforded by the use of heavier doping in the channel of the device of the present invention:

TABLE C

|  | $V_G$ (flash programming) | $V_G$ (selective erase) |
|---|---|---|
| Conventional doping ($Vt_i = 1.5$ V) | 21 V | −8 V |
| Heavy doping ($Vt_i = 4.5$ V) | 18 V | −11 V |

In a conventional device, the initial voltage threshold is approximately 1.5 V. If conventional doping was used in the device of the present invention, the flash program function would require a gate voltage of approximately 21 V and the gate voltage needed for the selective erase mode would be approximately −8 V. Giving the peripheral devices a 3 V margin of safety causes the breakdown voltage requirement for the peripheral devices to be approximately 24 V. As can be seen in Table C, increasing the voltage threshold by heavier doping decreases the selective erase voltage to 18 V and thus decreases the breakdown voltage requirement, based upon a 3 V margin of safety, to 21 V.

Triple Well

Because the device of the present invention can perform the selective erase function using a negative gate voltage, it may be necessary to provide means for isolating the large negative potential from the surrounding circuitry in order to prevent high voltage stresses at the junctions of those devices.

There are two possible means for preventing the negative gate voltages from disrupting the peripheral circuitry. One is to only use PMOS devices in connection with the negative gate voltage and to employ depletion P-channel devices if voltage passing is required. However, such a structure seriously limits the design of the chip and for that reason may be undesirable for certain applications.

The other way is to employ the "triple well" structure described below. The triple well structure is one which will alleviate the problem of high voltage stresses caused by the −12 V potential being applied to the control gate during the erase operation. If NMOS devices are to be used to deliver the negative gate voltage during the selective erase function, the triple well structure should be used. If it is not desired to use negative voltages for erasure, the triple well should not be used because its manufacture requires two additional mask steps and thus increases processing time and expense.

Figure 13:
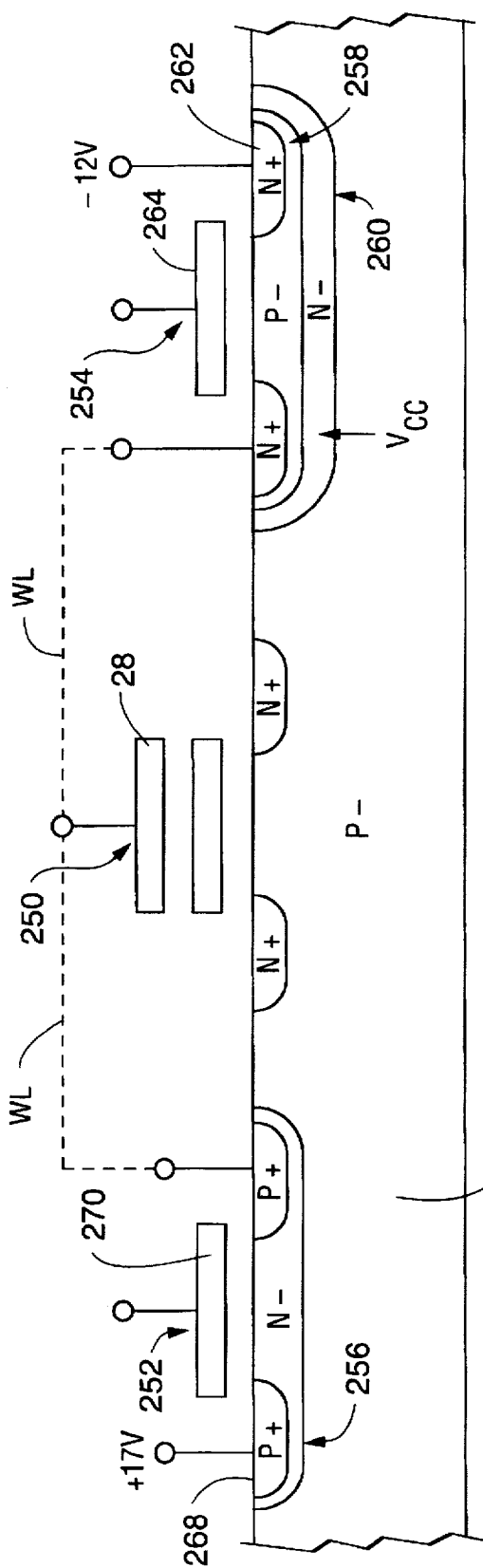
FIG. 13 is a partial cross-sectional side view of a memory device according to the invention illustrating the use of a triple-well structure.
Figure 14:
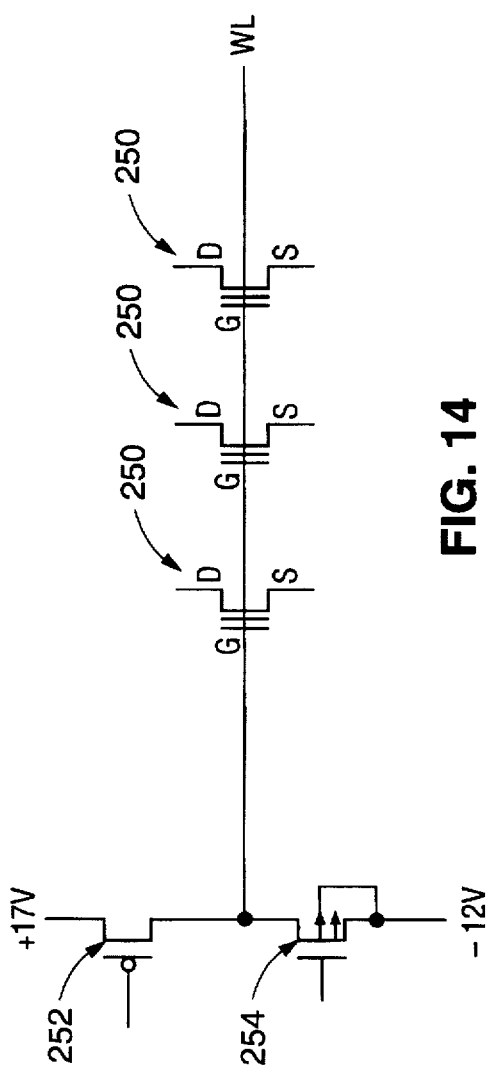
FIG. 14 is a simplified schematic representation of the device of FIG. 13.

The triple well structure is shown in the simplified drawings of FIGS. 13 and 14. FIG. 13 is a simplified cross section illustrating the different transistor structures, while FIG. 14 is a simplified electrical schematic of the structures involved in supplying positive and negative voltages to the memory cell via word line WL.

The triple well structure is comprised generally of a single-well transistor 252 and a double-well transistor 254 each coupled to the word lines WL associated with the control gates 28 of the storage cells 250 of the present invention. It should be appreciated that, although a single memory cell 250 is shown in FIG. 13 and a single row of memory cells 250 are shown in FIG. 14, the transistors like those of transistors 252, 254 are intended to be utilized for delivering voltages to all cells in an array according to the present invention when a triple well structure is employed. Further, it is to be understood that in order to simplify this explanation, not all of the devices are shown which are involved in controlling the application of the positive and negative potentials to the cell control gate; and that such devices are used in a conventional arrangement.

The single well transistor is a PMOS transistor 252 formed within a well 256 of N⁻ type material. This is the transistor through which the positive voltage (i.e. approximately 17 V to 18 V) is delivered to the control gates 28 of memory cells 250 during the flash programming cycle. The positive voltage is applied to the source 268 of the single-well transistor and, when a control voltage is applied to the gate 270 of the single-well transistor during the flash programming operation, is delivered to the control gates of the memory cells 250 via the word line WL. During the flash programming operation, NMOS transistor 254 is biased off.

The double-well transistor is an NMOS transistor 254 and is formed within a well 258 of P⁻ type material which in turn is isolated from the substrate by a well 260 of N⁻ type material. The NMOS device 254 is that through which the negative gate voltage (i.e. approximately −11 V to −12 V) for the flash erase function is intended to be delivered to the control gates of the memory cells 250 during a selective erase operation. The negative voltage is applied to the source 262 of the double-well transistor and, when a control voltage is applied to the gate 264 of the double-well transistor during the selective erase operation, is delivered to the control gates of the selected cells via the word line WL. During this operation, well 260 is at $V_{CC}$ or lower, and the substrate 266 is grounded. Thus there are two reverse-biased junctions, one between the substrate 266 and well 260 and the other between the wells 260, 258 which isolate the negative voltage from the other devices on the chip.

Array Operation

Figure 7:
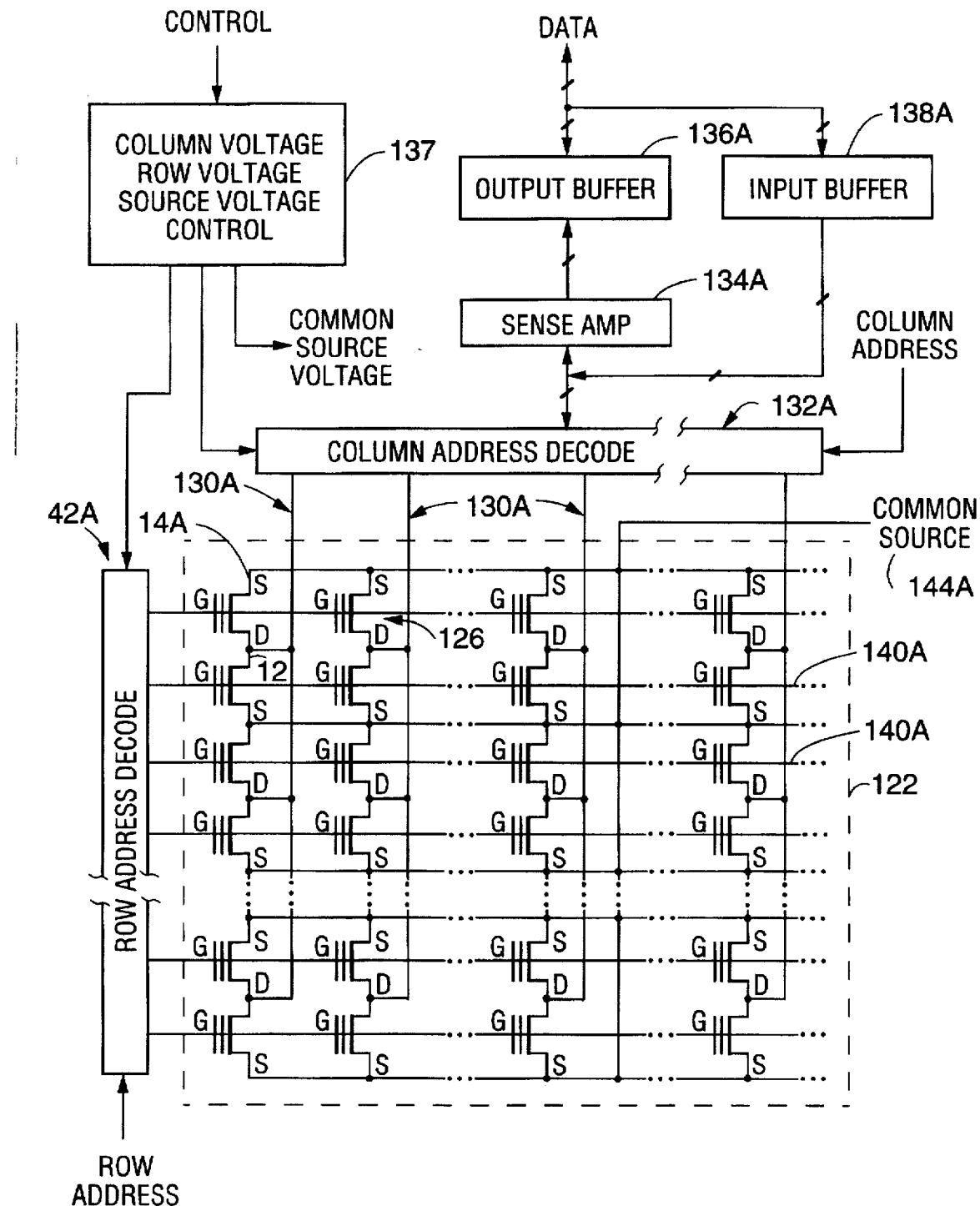
FIG. 7 is a simplified schematic drawing of EEPROM cells of the present invention connected in a memory array with a flash program feature and a selective erase feature.

A cell array may be configured as shown in FIG. 7. As can be seen, this configuration is substantially the same as that shown for the flash EEPROM array of FIG. 1A. A plurality of column lines 130A each connect the drains 12 of the cells of an associated column, and the common source line 144A is coupled to all of the sources 14A in the array 122A. A plurality of word lines 140A each connect the control gates of the cells in as associated row.

The peripheral circuitry on the device includes conventional row address decoding circuitry 142A, column address decoding circuitry 132A, sense amplifier circuitry 134A, output buffer circuitry 136A and input buffer circuitry 138A. Included in the peripheral circuitry is a block of circuitry which controls in a conventional manner the supplying of column, row, and source voltages to the array, for the above described flash programming, selective erase, read, over-erase detect, and over-erase repair modes.

Figure 11:
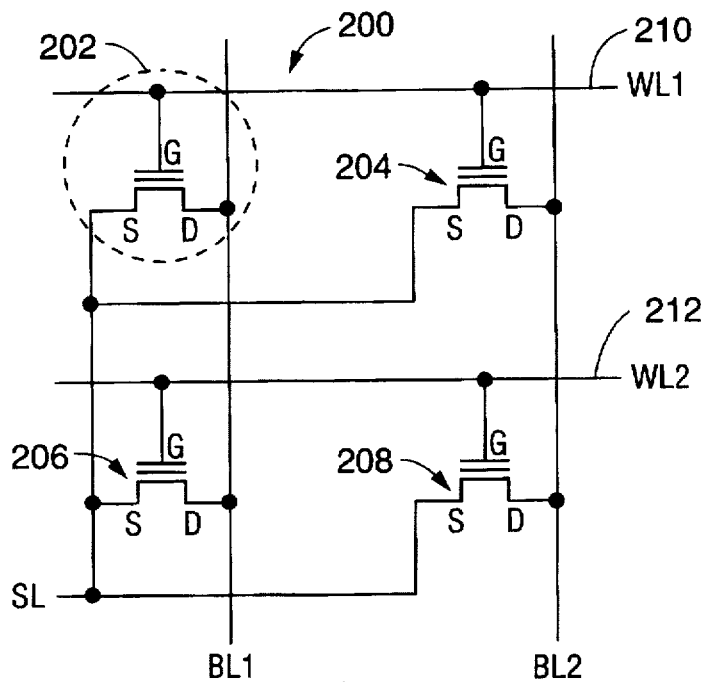
FIG. 11 is a simplified schematic drawing of a memory device according to the present invention showing four cells in an array.

For purposes of describing the operation of an array of cells of the present invention, a highly simplified schematic representation of a memory device, showing four cells 202, 204, 206, 208 in an array 200 of cells, is shown in FIG. 11. The drains of cells 202 and 206 are coupled to bit line BL1 and the drains of cells 204 and 208 are coupled to bit line BL2. The gates of cells 202 and 204 are coupled to word line WL1 and the gates of cells 206 and 208 are coupled to word line WL2. The sources of all cells are coupled to common source line SL.

The following table provides parameters for the read, flash program, and selective erase operations relative to target cell 202 in the array:

TABLE D (for target cell 202)

|  | Read | Flash Program | Selective Erase |
|---|---|---|---|
| $V_{BL1}$ | 1–2 V | F | 5 V |
| $V_{BL2}$ | F to $V_{SS}$ | F | F |
| $V_S$ | 0V | 0V | F |
| $V_{WL1}$ | $V_{CC}$ | 17 V | –11 V |
| $V_{WL2}$ | 0V | 0V | 0V |

Referring to FIG. 11, to determine the logical condition of a selected cell 202, the read voltage $V_{CC}$ is delivered to WL1, the word line associated with selected cell 202. $V_{CC}$ is normally 5 V, although in devices such as those configured for use with a notebook computers, for example, $V_{CC}$ may be approximately 3 V. The bit line BL1 associated with selected cell 202 is held at ground potential as is the common source line SL. The word lines for all unselected cells, i.e. WL2 in FIG. 11, are also held at ground potential. The unselected bit lines, i.e. BL2 in FIG. 11 are left floating or are held at a voltage which may be as high as $V_{SS}$, which is typically 0 V.

To perform the flash programming step for all cells within row 210, the word line WL1 associated with that row is elevated to a potential of approximately 17 V while the common source line SL and the remaining word lines, i.e, WL2 in FIG. 11, are held at ground potential. All bit lines BL1, BL2 are left floating. All cells in the array may be flash programmed by elevating all word lines to approximately 17 V. As described earlier, during the flash programming operation, electrons are placed on the floating gates of the cells being programmed by the occurrence of Fowler-Nordheim tunneling from the source to the floating gate.

The selective erase may be carried out for individual cells or in blocks of cells. To selectively erase cell 202, a voltage of approximately –11 V to –12 V is applied to the word line WL1 associated with cell 202 and a voltage of approximately 5 V is applied to the bit line BL1 associated with cell 202. The remaining bit line BL2 is left floating and the remaining word line WL2 is grounded. The common source line SL is left floating during the selective erase operation. Blocks of cells may be selectively erased by applying the selective erase parameters to the bit lines and word lines associated with the cells desired to be erased. As described earlier, the selective erase operation causes electrons to leave the floating gate by action of Fowler-Nordheim tunneling from the floating gate to the drain of the selected cell or cells.

The over-erase detect and recovery operations of an array according to the present invention will next be discussed.

Figure 12:
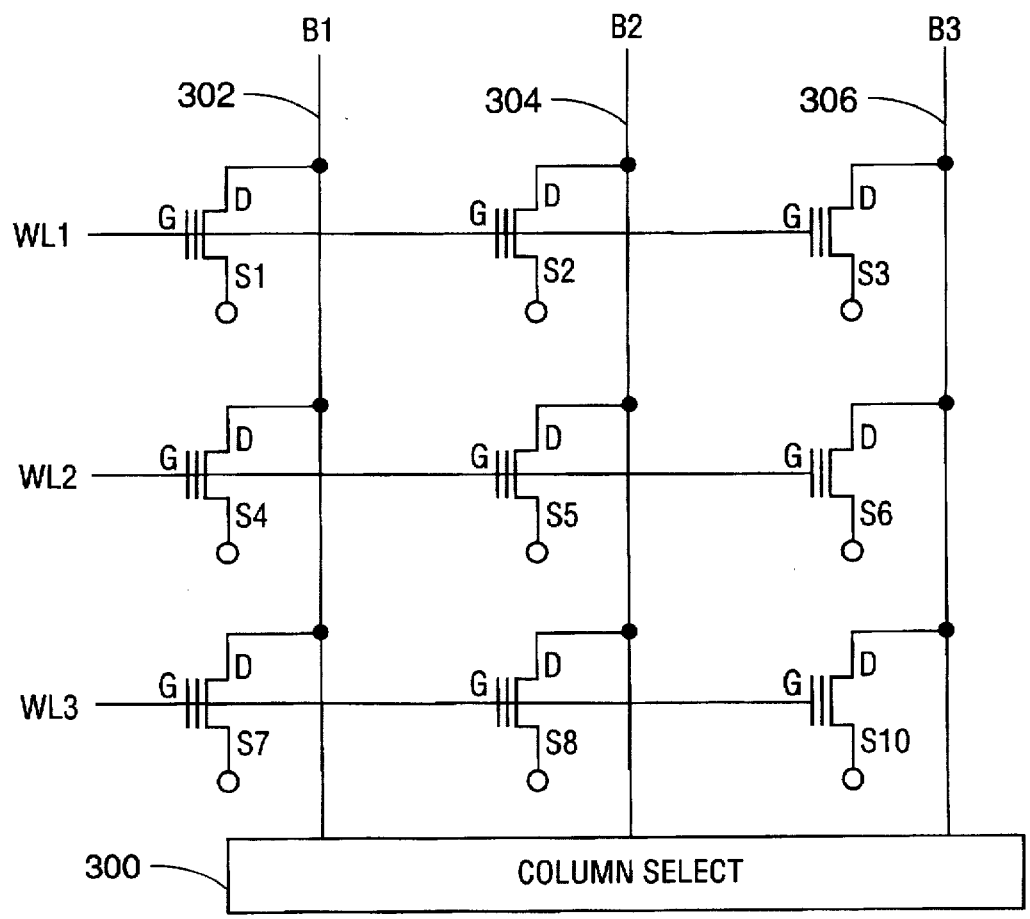
FIG. 12 is a simplified schematic representation for use in explaining prior over-erase recovery methods.

Conventional over-erase detection techniques will be described with reference to FIG. 12. These techniques only provide for identification of blocks or columns of cells having over-erased cells and do not provide for specific identification of over-erased cells.

In conventional detection methods, column select circuitry 300 is employed to select the column of cells desired to be tested. Assuming that column 302 is chosen, a read bias voltage is applied to the bit line B1 coupled to column 302. A potential of 0 V is applied to all word lines WL1, WL2, WL3 associated with the cells in the column 302, and the sources S1, S4, S7 of all cells in the column are grounded. A sense amplifier (not shown) is used to determine whether current is flowing into the bit line B1, which would indicate that an over-erased cell is present in column 302. Thus, with this method, it can only be determined whether there is an over-erased cell within a column of cells.

If it is desired to test an entire block of cells for the presence of over-erased cells, all columns 302, 304, 306 are selected using the column select circuitry 300. All sources S1–S9 are grounded. The bias potential is applied to all bit lines B1, B2, B3 and the sense amplifier is configured to detect for the presence of current flowing through any of the bit lines.

Thus, in conventional over-erase detection, individual over-erased cells cannot be detected.

Normally, the sense amplifier for conventional devices is configured to give an output of 0 if there is no current flowing in the bit line (and thus no over-erased cells in the column), and to give an output of 1 to indicate the presence of an over-erase condition if current is flowing through the bit line.

Several slow programming methods for bringing the voltage thresholds of over-erased cells up to a proper level are described in the prior art. Each of these methods will now be described with respect to FIG. 12. One such over-erase recovery method is carried out column by column. It involves elevating the bit line B1 of a selected column 302 to 5 V, grounding the sources S1, S4, S7, and applying a 1 V to 2 V potential to the word lines WL1, WL2, WL3 associated with the cells in the column 302. The column is periodically re-tested to determine whether over-erased cells remain and, if they do, the test conditions are reapplied until it is determined that the column no longer includes over-erased cells.

A second existing over-erase recovery method which is also carried out on a column-by-column basis involves grounding the word lines WL1, WL2, WL3 associated with the cells in the column 302, grounding all sources S1, S4, S7, and applying a 5 V voltage to the bit line B1 associated with the column. A third and similar recovery method has been described in which the word lines WL1, WL2, WL3 and the bit lines B1, B2, B3 associated with the column 302 of cells to be repaired are grounded while the sources S1, S4, S7 of the cells in the column are elevated to a 5 V potential.

A fourth prior art recovery method is one which is directed towards repairing all over-erased cells in an entire cell array. It involves grounding the source lines S1–S9 and the bit lines B1, B2, B3 while a voltage of 12 V is applied to the word lines WL1, WL2, WL3.

Over-erase Detection in Array

The presence of over-erased cells in the memory device of the present invention may be detected and remedied using a procedure represented by the flow diagrams of FIGS. 9, 10A, 10B, and 11. It is first determined what group of cells include over-erased cells. Once such a group is determined, the cells in the group are checked cell-by-cell to identified the specific over-erased cell(s).

The following table provides parameters which may be used for carrying out the over-erase detect and recovery operations:

TABLE E

|  | Selected Cell Over-Erase | Selected Cell Over Erase Recover | |
|---|---|---|---|
|  | Detect | Method 1 | Method 2 |
| $V_{BL1}$ | 1–2 V | F | 0V |
| $V_{BL2}$ | F | F | 0V |
| $V_S$ | ~0.6 V | $V_{SS}$ | F |
| $V_{WL1}$ | $V_{TEST}$ | 12 V | 12 V |
| $V_{WL2}$ | 0V | 0V | 0V |

Over-erase detection first requires defining the voltage threshold below which a cell is said to be over-erased and by then calculating the source voltage $V_S$ and the test voltage $V_{test}$ using the procedure described earlier with respect to cell operation. Referring to the schematic array diagram of FIG. 11, to determine whether cell 202 is over-erased, the bit line BL1 associated with cell 202 is elevated to approximately 1.5 V, and the common source line SL is raised to the bias voltage $V_S$ (preferably 0.6 V). The test voltage $V_{test}$ is applied to word line WL1 associated with cell 202. The word line WL2 associated only with unselected cells is held at a potential of 0 V and the bit line BL2 associated only with unselected cells is left floating. If the cell 202 is over-erased, current will flow through bit line BL1.

Testing is most efficiently carried out by first testing blocks or columns in order to first target those having over-erased cells and then subsequently testing individual cells to pinpoint the over-erased ones. For example, the entire column of cells having cell 202 may be tested by applying 1.5 V to BL1 and by applying $V_{test}$ to all word lines, WL1, WL2, associated with cells in that row. The bit by bit testing method described in the preceding paragraph is next utilized within columns found to have over-erased cells until all of the over-erased cells are identified.

Figure 9:
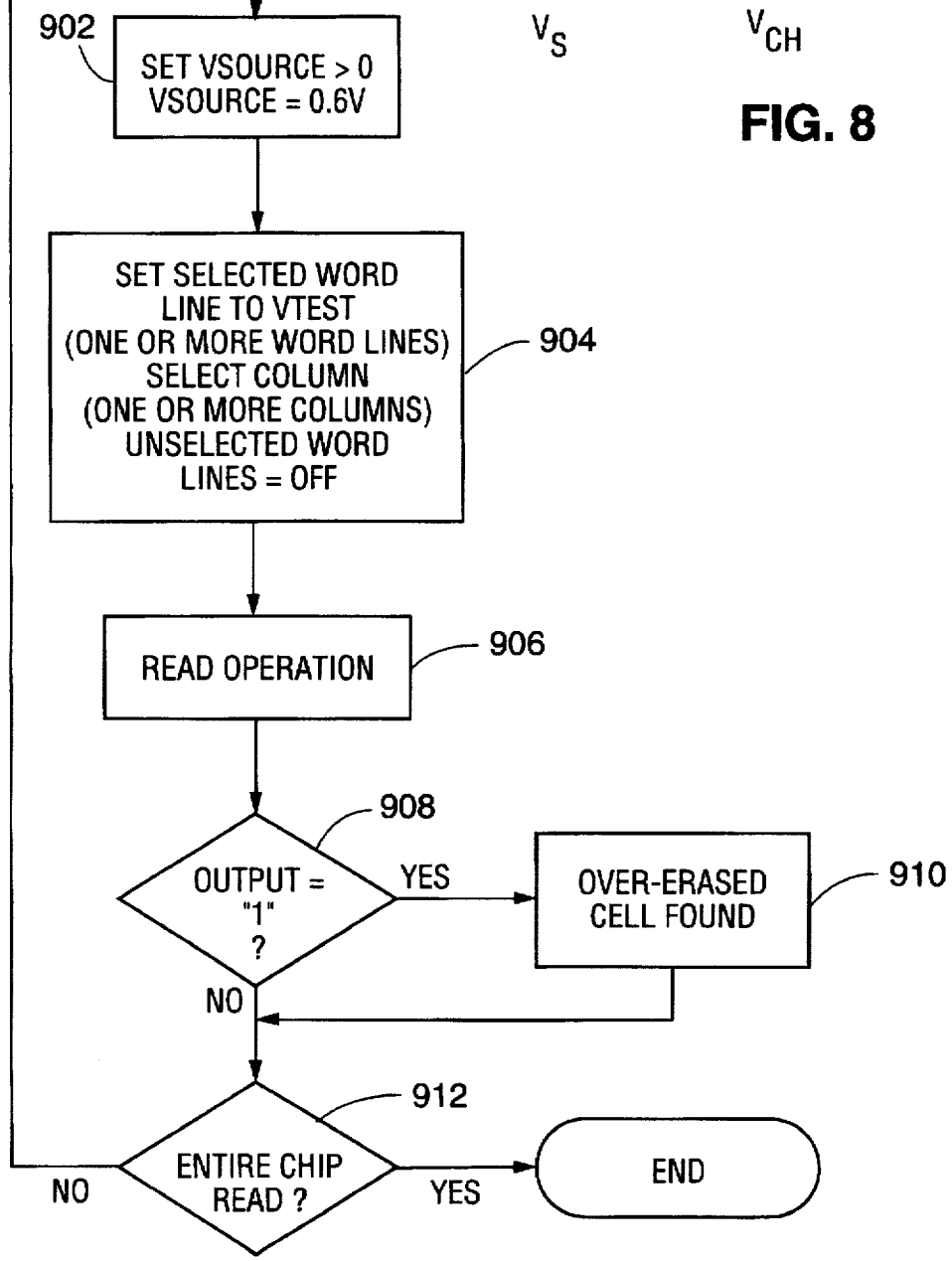
FIG. 9 is a simplified flow diagram illustrating the over-erase detection method of the present invention.

Referring now to FIG. 9, a generalized over-erase detection flow diagram is shown according to the present invention. First, all sources are biased to a voltage greater than zero, preferably 0.6 V. This is accomplished in step 902. In step 904, one or more word lines are set to $V_{test}$ and one or more columns are selected to be read. Unselected wordlines are biased to 0 V to turn their associated cells off.

If a single column and a single word line are so selected, then the cells will be checked on a cell by cell basis. Different multiples of cells in a row or column can be checked at one time depending upon the number of word lines to which $V_{test}$ is applied, and the number of column lines which are selected for reading. For example, $V_{test}$ is applied to all word lines, and a single column is selected to be read, then all cells within the column will be checked at one time for an over-erased condition. If a single word line is biased with $V_{test}$, and all columns are selected, then all cells within the row corresponding to the biased word line will be checked for an over-erased condition.

Step 906 reads the condition of the cell(s) to which $V_{test}$ has been applied. In step 908, if a logic "1" is detected, this indicates that an over-erased cell has been found. This is noted in step 910.

Step 912 causes over-erase detection to continue until the entire chip has been read.

If over-erase detection by column is used, once columns with over-erased cells are identified, the cells within those columns are checked bit by bit to identify the over-erased cells.

The following two methods, which will be described with reference to Table E and FIG. 11, may be used for repairing over-erased cells. To repair over-erased cell 202 in FIG. 11 using Method 1, a 20 msec pulse of 12 V is delivered to WL1. The bit line BL1 associated with cell 202 is left floating and a voltage of $V_{SS}$, preferably 0 V, is applied to the source line SL. The bit line BL2 is left floating and WL2 is grounded.

The cell is next tested using the over-erase detection method. If the cell is still over-erased the recovery method will be repeated. In the preferred device, a repaired cell will normally have a voltage threshold of approximately 1.3 V to 2.5 V.

To repair over-erased cell 202 using Method 2, a 20 msec pulse of 12 V is delivered to WL1. The bit line BL1 associated with cell 202 is grounded and the source line SL is left floating. The bit line BL2 and the word line WL2, which are not associated with cell 202, are grounded.

As with Method 1, the cell is next tested using the over-erase detection method and the recovery technique is repeated if the cell is not sufficiently repaired.

Methods 1 and 2 are illustrated in more generalized form in FIGS. 10A and 10B. In these figures, the methods are applied to repairing more than a single cell at time. FIG. 10A illustrates method 1, in accordance with the present invention. In step 1002 all sources are floated. Thereafter in step 1004, selected columns are grounded. Step 1006 then sets all word lines or a selected word line to a potential, preferably 12 V, for 20 msec or more. Where all word lines are set to this potential, all cells in the selected columns are subjected to this low level write operation. Where selected word lines are set to this potential, the cells within those selected columns and rows are repaired.

In FIG. 10B, recovery method 2 is illustrated. Here, the drains of the cells are floated in step 1010, and all sources are grounded in step 1012. Thereafter, in step 1014 all or selected ones of the word lines are raised to a potential, preferably of 12 V, for 20 msec or more.

Processing

The cell of the present invention is compatible with CMOS processing. The substrate 10 is formed of a p-type material having a 1-0-0 orientation and a resistivity of 17 to 33 ohmscentimeter. This represents the p-substrate 10 in FIGS. 2A through 2C. Phosphorous 31 material is implanted in the N⁻wells at 150 KeV with a density of $5.0 \times 10^{12}/cm^2$. The implant is driven into the wells by way of a wet oxidation for 45 minutes at 950° C., followed by a nitrogen, $N_2$ drive at 1150° C.

Thereafter a gate oxide having a thickness of preferably 80 Å is formed. The field area is then defined and the field is implanted with $BF_2$ at 50 KeV and a dose of $4 \times 10^{13}/cm^2$.

Field oxide is then formed at 1000° C. for 40 minutes in an atmosphere of $O_2$, followed by 85 minutes at 920° C. in an atmosphere of $N_2$. Followed by six hours and 40 mins. at 1000° C. in $H_2/O_2$ to obtain a thickness of 12000 Å. The cell area is then defined and thereafter implanted with boron 11 at 50 KeV and a dose of $6 \times 10^{13}/cm^2$. The preceding fabrication processes are conventional.

In the next step the floating gate 24 is deposited over the gate dielectric 18. This involves in situ doping of polysilicon when the polysilicon is deposited as the floating gate. To do this, $SiH_4$ and $PH_3$ are combined by way of chemical vapor deposition to form Si (phosphorous-doped). By in site doping of the polysilicon material additional high temperature fabrication steps can be avoided. This is important in order to minimize the grain size in the polysilicon. It has been found that with a smaller grain size of polysilicon, a smoother polysilicon surface is obtained thus permitting reliable thinner layers of oxide to be grown on the polysilicon surface.

The interpoly dielectric is preferably a ONO layer of 200 Å effective thickness formed using a standard high temperature oxide deposition process so as to optimize endurance. However, the need for HTO deposition may not be needed if a negative gate potential is not used during the selective erase operation. First, a oxide layer is formed over the floating gate in an atmosphere of 5% $O_2$ and 95% $N_2$ at 950° C. for eight (8) minutes. Nitride is then deposited for four (4) minutes at a rate of 30 Å/min. Thereafter, HTO deposition is performed for fifteen (15) minutes at a rate of 4 to 5 Å/min.

An alternative methodology for forming the ONO interpoly layer involves forming an oxide layer over the floating gate in an atmosphere of 5% $O_2$ and 95% $N_2$ at 950° C. for twelve (12) minutes. Nitride is then deposited to a thickness of 120 Å. Thereafter, a wet oxidation is performed at 940° C. for 1 to 3 hours.

Thereafter, peripheral circuitry, such as sense transistors, address transistors, etc. are fabricated by conventional means. The control gate 28 is subsequently formed, preferably of polysilicon, and is doped by conventional methods.

Implantation of the source 14 and drain 12 regions will next be described. Four alternative embodiments will be disclosed, two for cells utilizing 0.8 μm technology and two for cells utilizing 0.5 μm technology.

In the preferred method for forming the source and drain regions in a cell utilizing 0.8 μm technology, the source region 14 is implanted with arsenic at 80 KeV and a dose of $5.0 \times 10^{15}/cm^2$. The preferred drain region is a double diffusion region formed by first implanting phosphorus 31 at 150 KeV and a dose of $1.0 \times 10^{14}/cm^2$. The drain region is next annealed for 60 minutes in $N_2$ at a temperature of 900° C., and then for 20 minutes in $O_2$ at 900° C. so as to allow diffusion to occur. A $5.0 \times 10^{15}/cm^2$ dose of arsenic at 80 KeV is next implanted into the drain region.

An alternative method for forming the source and drain regions in 0.8 μm technology cells is a simpler process with a reduced mask set, but is one which provides less endurance than the preferred method. In the alternative method, the source region is implanted with arsenic at 80 KeV and a dose of $5.0 \times 10^{15}/cm^2$ to form a single diffused source such as the one shown in FIG. 2A. The drain region is implanted with a $5.0 \times 10^{15}/cm^2$ dose of arsenic at 80 KeV.

In the preferred method for forming the source and drain regions in a cell utilizing 0.5 μm technology, the source region is formed of a shallow region 40B, of $N^+$ material, with a pocket of P-type material 42B, as that shown in FIG. 2C, which helps to minimize punch-through problems. The source region is implanted with a $1.5 \times 10^{15}/cm^2$ dose of arsenic at 80 KeV. A $5 \times 10^{13}/cm^2$ implant of boron 11 is implanted at an angle of 45° to form the P-pocket. The drain region is a double diffusion region formed by first implanting phosphorous 31 at a dose of $1.0 \times 10^{14}/cm^2$ at 150 KeV and annealing it at 900° C. for 45 minutes in $N_2$ and for 20 minutes in $O_2$. A $5.0 \times 10^{15}/cm^2$ implant of arsenic is next implanted at 80 KeV.

An alternative method for implanting source and drain regions in 0.5 μm technology cells uses a source region having a P-type pocket formed using the method described in the preceding paragraph. The drain region is implanted with arsenic at a dose of $5.0 \times 10^{15}$ at 80 KeV. This alternative embodiment is simpler to make than the preferred embodiment, but it has less endurance than the preferred embodiment.

The following table is representative of the results that can be achieved using the cell of the present invention. An experiment was conducted in which the flash program, selective erase, and over-erase recovery operations were performed on the cells under test. The threshold voltages were measured following each operation. It should be noted that the cells under test had lighter channel doping than is preferred for the cell of the present invention and thus had a lower initial voltage threshold ($Vt_i$) than the preferred $Vt_i$ (i.e. approximately 4.5 V) for the present invention. Thus, the voltages ($V_{CG}$) applied to the control gates were higher than will be needed for a device having the preferred channel doping. Moreover, the test devices had a 200 Å tunnel oxide whereas the devices of the present invention have a preferred tunnel oxide thickness of approximately 80 Å.

During the experiment, ten millisecond pulses were used to carry out the flash program, selective erase, and over-erase recover functions.

TABLE F

| Cell No. | $V_{ti}$ | Flash Program $V_{CG} = 20\ V$ | Selective Erase $V_{CG=8\ V}$ $V_{D=5\ V}$ | Over Erase Recover $V_{CG=15\ V}$ |
|---|---|---|---|---|
| 1 | 1.42 | 5.54 | 1.66 | 2.58 |
| 2 | 1.26 | 4.86 | 1.44 | 1.84 |
| 3 | 1.24 | 5.04 | 1.26 | 1.52 |
| 4 | 1.32 | 5.7 | 1.28 | 1.52 |
| 5 | 1.36 | 5.46 | 1.62 | 1.92 |
| 6 | 1.32 | 4.84 | 2.06 | 2.12 |
| 7 | 1.40 | 4.86 | 2.04 | 2.08 |
| 8 | 1.30 | 5.42 | 1.62 | 1.90 |
| 9 | 1.30 | 5.40 | 1.54 | 1.82 |
| 10 | 1.38 | 5.72 | 1.82 | 1.82 |

The terms and expressions which have been employed here are used as terms of description and not of limitations, and there is no intention in the use of such terms and expressions of excluding equivalence of the features shown and described, or portions thereof, it being recognized that various modifications are possible within the scope of the invention claimed.

What is claimed is:

1. A method of determining whether an electrically erasable and programmable device has been over-erased, wherein the device is of the type having a source, a drain, a control gate, and a floating gate positioned between the control gate and the source and drain, the method comprising the steps of:

(a) applying a first voltage to the drain;
   (b) applying a second voltage to the source, the second voltage being lower that the first voltage, and selected to bias an over-erased devices into a non-conducting state;
   (c) separately applying a range of potentials to the control gate; and
   (d) determining whether current is flowing from the drain to the source during application of the range of potentials to the control gate, which, when the potential of the control gate is within the range, is an indication that the device has been over-erased.

2. The method of claim 1 wherein:
   step (a) comprises the step of applying a voltage of approximately 1.5 volts to the drain;
   step (b) comprises the step of applying a voltage of approximately 0.6 volts to the source; and
   step (c) comprises the step of applying voltages in the range of approximately 0 volts to approximately 0.5 volts to the control gate.

3. The method of claim 1 wherein:
   step (a) comprises the step of applying a voltage of approximately 1.2 volts to the drain;
   step (b) comprises the step of applying a voltage of approximately 0.6 volts to the source; and
   step (c) comprises the step of applying a voltage of approximately 1.6 volts to the control gate.

* * * * *